(12) United States Patent
Sugishita et al.

(10) Patent No.: US 12,461,507 B2
(45) Date of Patent: Nov. 4, 2025

(54) SUBSTRATE PROCESSING APPARATUS, SUBSTRATE PROCESSING METHOD, SEMICONDUCTOR DEVICE MANUFACTURING METHOD, AND CONTROL PROGRAM

(71) Applicant: KOKUSAI ELECTRIC CORPORATION, Tokyo (JP)

(72) Inventors: Masashi Sugishita, Toyama (JP); Yuuji Urano, Toyama (JP); Kiyohiko Maeda, Toyama (JP); Masaaki Ueno, Toyama (JP); Tetsuya Kosugi, Toyama (JP); Masaya Nishida, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/921,652

(22) Filed: Jul. 6, 2020

(65) Prior Publication Data

US 2020/0333766 A1   Oct. 22, 2020

Related U.S. Application Data

(63) Continuation of application No. 14/650,074, filed as application No. PCT/JP2013/082573 on Dec. 4, 2013, now abandoned.

(30) Foreign Application Priority Data

Dec. 7, 2012   (JP) .................. 2012-268803

(51) Int. Cl.
G05B 19/418   (2006.01)
C23C 16/44   (2006.01)
(Continued)

(52) U.S. Cl.
CPC ........ *G05B 19/418* (2013.01); *C23C 16/4411* (2013.01); *C23C 16/52* (2013.01);
(Continued)

(58) Field of Classification Search
CPC ........ G05B 19/418; G05B 2219/45031; H01L 21/67109; H01L 21/67248; C23C 16/4411; C23C 16/52; H01J 2237/332–3348
(Continued)

(56) References Cited

U.S. PATENT DOCUMENTS 5,561,087 A * 10/1996 Mikata ............... C23C 16/46
                                                           438/758
5,616,264 A   4/1997 Nishi et al.
(Continued)

FOREIGN PATENT DOCUMENTS

JP   2001-308085 A   11/2001
JP   2005-188869 A   7/2005
(Continued)

OTHER PUBLICATIONS

International Search Report, PCT/JP2013/082573, Mar. 18, 2014, 4 pgs. (2 pgs—Japanese Language; 2 pgs—English Language) (*cited in parent application).
(Continued)

*Primary Examiner* — Charlee J. C. Bennett
(74) *Attorney, Agent, or Firm* — Volpe Koenig

(57) ABSTRACT

The present disclosure provides a substrate processing apparatus, a substrate processing method, a semiconductor device manufacturing method, and a control program capable of controlling thickness uniformity of a film formed on a substrate. The substrate processing apparatus includes a process chamber into which a substrate is transferred; a heating device heating the substrate, transferred into the
(Continued)

process chamber, from its periphery side; a cooling device cooling the substrate, transferred into the process chamber, from its periphery side; a process gas supply unit supplying a process gas into the process chamber; and a control unit controlling the heating device and the cooling device to generate temperature difference between a center and the periphery sides of the substrate and controls the process gas supply unit. The control unit operates the process gas supply unit to stop operation of the cooling device during supply of the process gas into the process chamber.

18 Claims, 14 Drawing Sheets

(51) Int. Cl.
  *C23C 16/52* (2006.01)
  *H01L 21/67* (2006.01)
(52) U.S. Cl.
  CPC .. *H01L 21/67109* (2013.01); *H01L 21/67248* (2013.01); *G05B 2219/45031* (2013.01)
(58) Field of Classification Search
  USPC .......................................................... 700/121
  See application file for complete search history.

(56) References Cited

U.S. PATENT DOCUMENTS

| | | | |
|---|---|---|---|
| 5,702,531 A | 12/1997 | Mikata | |
| 6,787,377 B2* | 9/2004 | Wang | H01L 22/20 374/137 |
| 7,138,607 B2 | 11/2006 | Wang et al. | |
| 7,278,587 B2 | 10/2007 | Ohminami | |
| 7,727,780 B2 | 6/2010 | Sugishita et al. | |
| 2003/0104664 A1* | 6/2003 | Kondo | H01L 21/02532 257/E21.414 |
| 2009/0029486 A1* | 1/2009 | Ueno | H01L 21/67109 438/5 |
| 2009/0197352 A1* | 8/2009 | Ueno | H01L 21/67109 438/5 |
| 2012/0214317 A1* | 8/2012 | Murobayashi | C23C 16/4408 118/724 |
| 2016/0376697 A1* | 12/2016 | Fujinaga | H01J 37/3464 204/298.09 |

FOREIGN PATENT DOCUMENTS

| | | |
|---|---|---|
| JP | 2008-205426 A | 9/2008 |
| JP | 2009-081415 A | 4/2009 |
| KR | 10-2008-0070532 A | 7/2008 |
| KR | 10-2008-0080142 A | 9/2008 |
| WO | 2005/008755 A1 | 1/2005 |
| WO | 2007/105431 A1 | 9/2007 |

OTHER PUBLICATIONS

Korean Office Action issued Sep. 29, 2016 in the Korean Application No. 10-2015-7014978. (*cited in parent application).

* cited by examiner

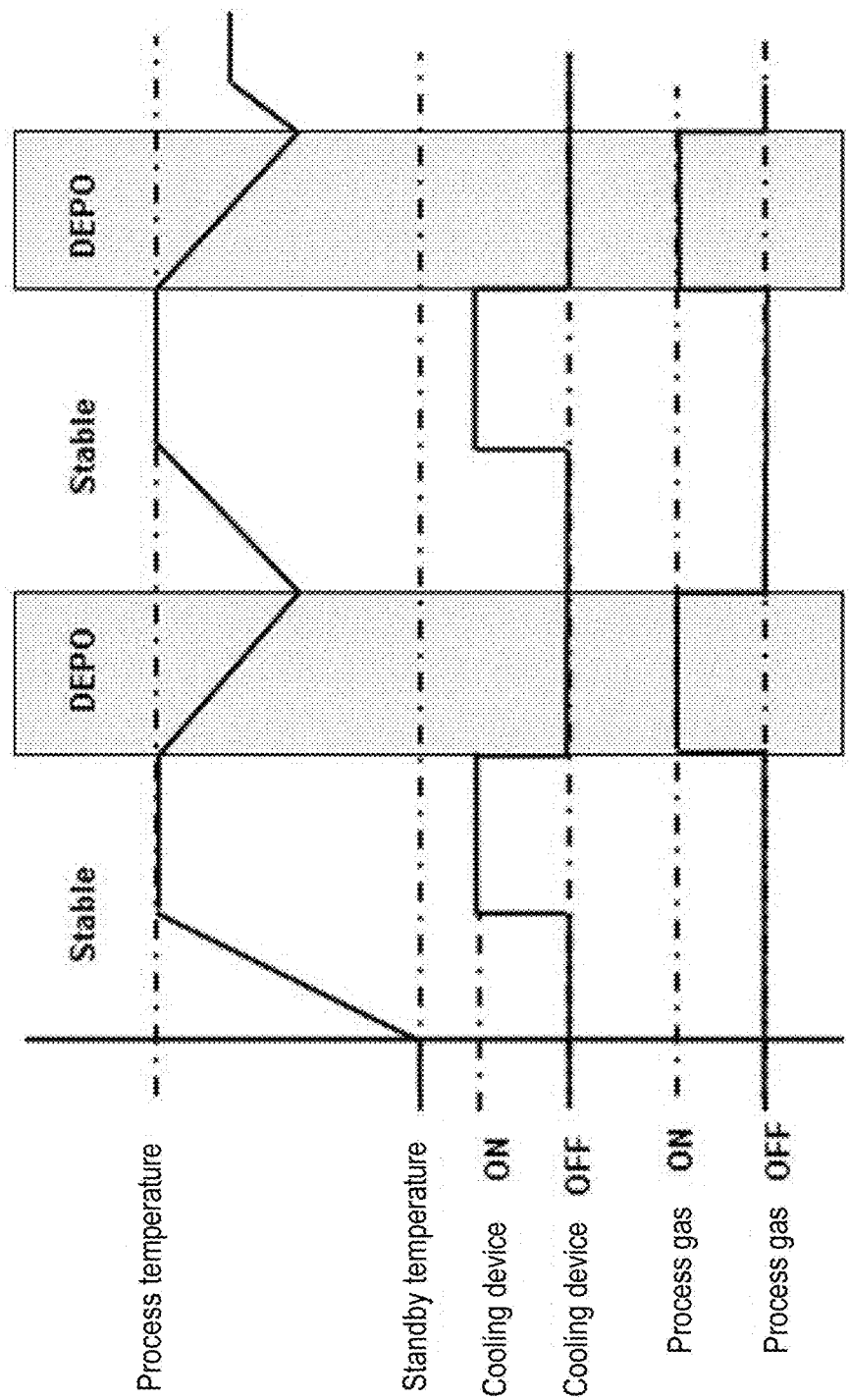

SUBSTRATE PROCESSING APPARATUS, SUBSTRATE PROCESSING METHOD, SEMICONDUCTOR DEVICE MANUFACTURING METHOD, AND CONTROL PROGRAM

CROSS REFERENCE TO RELATED APPLICATIONS

This application is a continuation of U.S. patent application Ser. No. 14/650,074, filed Jun. 5, 2015, which was a 371 application filed claiming the benefit of PCT/JP2013/082573 filed Dec. 4, 2013, which claims the benefit of Japanese Patent Application No. 2012-268803, filed on Dec. 7, 2012, all of which are incorporated by reference as if fully set forth.

TECHNICAL FIELD

The present disclosure relates to a substrate processing apparatus, a substrate processing method, a semiconductor-device manufacturing method, and a control program.

BACKGROUND

For example, Patent Document 1 discloses a substrate processing apparatus which determines a temperature change amount for realizing a desired average temperature deviation, by using a deviation between a temperature of a substrate edge portion and a temperature of a substrate center portion, which is generated when a heating temperature of a substrate is changed in a predetermined time period, and a deviation in a steady state between the temperature of the substrate edge portion and the temperature of the substrate center portion; controls a substrate heating temperature; and forms a film having uniform thickness on the substrate.

PRIOR ART DOCUMENT

Patent Document

International Publication No. 2005/008755

Even if the desired average temperature deviation disclosed in Patent Document 1 is realized, there is a limit in the thickness uniformity of the film formed on the substrate.

The present disclosure provides some embodiments of a substrate processing apparatus, a substrate processing method, a semiconductor device manufacturing method, and a control program, which are capable of controlling thickness uniformity of a film formed on a substrate.

SUMMARY

According to an aspect of the present disclosure, there is provided a substrate processing apparatus, including a process chamber into which a substrate is transferred; a heating device configured to heat the substrate, transferred into the process chamber, from a periphery side of the substrate; a cooling device configured to cool the substrate, transferred into the process chamber, from the periphery side of the substrate; a process gas supply unit configured to supply a process gas into the process chamber; and a control unit configured to control the heating device and the cooling device to generate a temperature difference between the center side and the periphery side of the substrate and controls the process gas supply unit, wherein the control unit executes a first control, in which the heating device and the cooling device are operated, and a second control, in which operation of at least the cooling device is stopped, after the first control; and operates the process gas supply unit to supply the process gas into the process chamber at least during execution of the second control.

In addition, the control unit may operate the process gas supply unit to supply the process gas into the process chamber for a specific time period at least after the first control is switched to the second control.

Further, the control unit may operate the process gas supply unit to start supplying the process gas into the process chamber when the first control is being executed.

Furthermore, the control unit may operate the process gas supply unit to supply the process gas into the process chamber only during the execution of the second control.

Additionally, the control unit may alternately and repeatedly execute the first control and the second control a predetermined number of times.

According to another aspect of the present disclosure, there is provided a substrate processing apparatus, including a process chamber into which a substrate is transferred; a heating device configured to heat the substrate transferred into the process chamber from a periphery side of the substrate; a cooling device configured to cool the substrate transferred into the process chamber from the periphery side of the substrate; a process gas supply unit configured to supply a process gas into the process chamber; and a control unit configured to control the heating device and the cooling device to generate a temperature difference between the center side and the periphery side of the substrate controls the process gas supply unit, wherein the control unit stops operation of the cooling device when the process gas supply unit is operated to supply the process gas into the process chamber.

According to still another aspect of the present disclosure, there is provided a substrate processing method, including a first process in which a substrate is transferred into a process chamber; a second process in which the substrate transferred into the process chamber is cooled from a periphery side of the substrate by a cooling device while the substrate is heated from the periphery side of the substrate by a heating device; a third process in which a process gas supply unit is operated to start supplying a process gas into the process chamber during execution of the second process; and a fourth process in which operation of the cooling device is stopped while the process gas is supplied in the third process after the second process ends.

According to yet another aspect of the present disclosure, there is provided a substrate processing method, including a first process in which a substrate is transferred into a process chamber; a second process in which the substrate transferred into the process chamber is cooled from a periphery side of the substrate by a cooling device while the substrate is heated from the periphery side of the substrate by a heating device; and a third process in which, after the second process ends, operation of the cooling device is stopped and a process gas supply unit is operated to supply a process gas into the process chamber.

According to yet another aspect of the present disclosure, there is provided a semiconductor device manufacturing method, including a first process in which a substrate is transferred into a process chamber; a second process in which the substrate transferred into the process chamber is cooled from a periphery side of the substrate by a cooling device while the substrate is heated from the periphery side of the substrate by a heating device; a third process in which a process gas supply unit is operated to start supplying a process gas into the process chamber during execution of the second process; and a fourth process in which operation of the cooling device is stopped while the process gas is supplied in the third process after the second process ends.

Further, according to an aspect of the present disclosure, there is provided a semiconductor device manufacturing method, including a first process in which a substrate is transferred into a process chamber; a second process in which the substrate transferred into the process chamber is cooled from a periphery side of the substrate by a cooling device while the substrate is heated from the periphery side of the substrate by a heating device; and a third process in which, after the second process ends, operation of the cooling device is stopped and a process gas supply unit is operated to supply a process gas into the process chamber.

According to another aspect of the present disclosure, there is provided a control program for causing a control unit to execute a first process in which a substrate is transferred into a process chamber; a second process in which the substrate transferred into the process chamber is cooled from a periphery side of the substrate by a cooling device while the substrate is heated from the periphery side of the substrate by a heating device; a third process in which a process gas supply unit is operated to start supplying a process gas into the process chamber during execution of the second process; and a fourth process in which operation of the cooling device is stopped while the process gas is supplied after the second process ends.

In addition, according to an aspect of the present disclosure, there is provided a control program for causing a control unit to execute a first process in which a substrate is transferred into a process chamber; a second process in which the substrate transferred into the process chamber is cooled from a periphery side of the substrate by a cooling device while the substrate is heated from the periphery side of the substrate by a heating device; and a third process in which, after the second process ends, operation of the cooling device is stopped and a process gas supply unit is operated to supply a process gas into the process chamber.

According to the present disclosure, it is possible to provide a substrate processing apparatus, a substrate processing method, a semiconductor device manufacturing method, and a control program, which are capable of controlling thickness uniformity of a film formed on a substrate

BRIEF DESCRIPTION OF THE DRAWINGS

FIG. 14 is a timing chart illustrating an example of a heating control and a process gas supply control of a substrate processing apparatus according to a sixth embodiment of the present disclosure.

DETAILED DESCRIPTION

Hereinafter, a substrate processing apparatus, a substrate processing method, a semiconductor device manufacturing method, and a control program according to the present disclosure are described.

First Embodiment

A first embodiment of the present disclosure is described below.
[Substrate Processing Apparatus 1]

Figure 1:
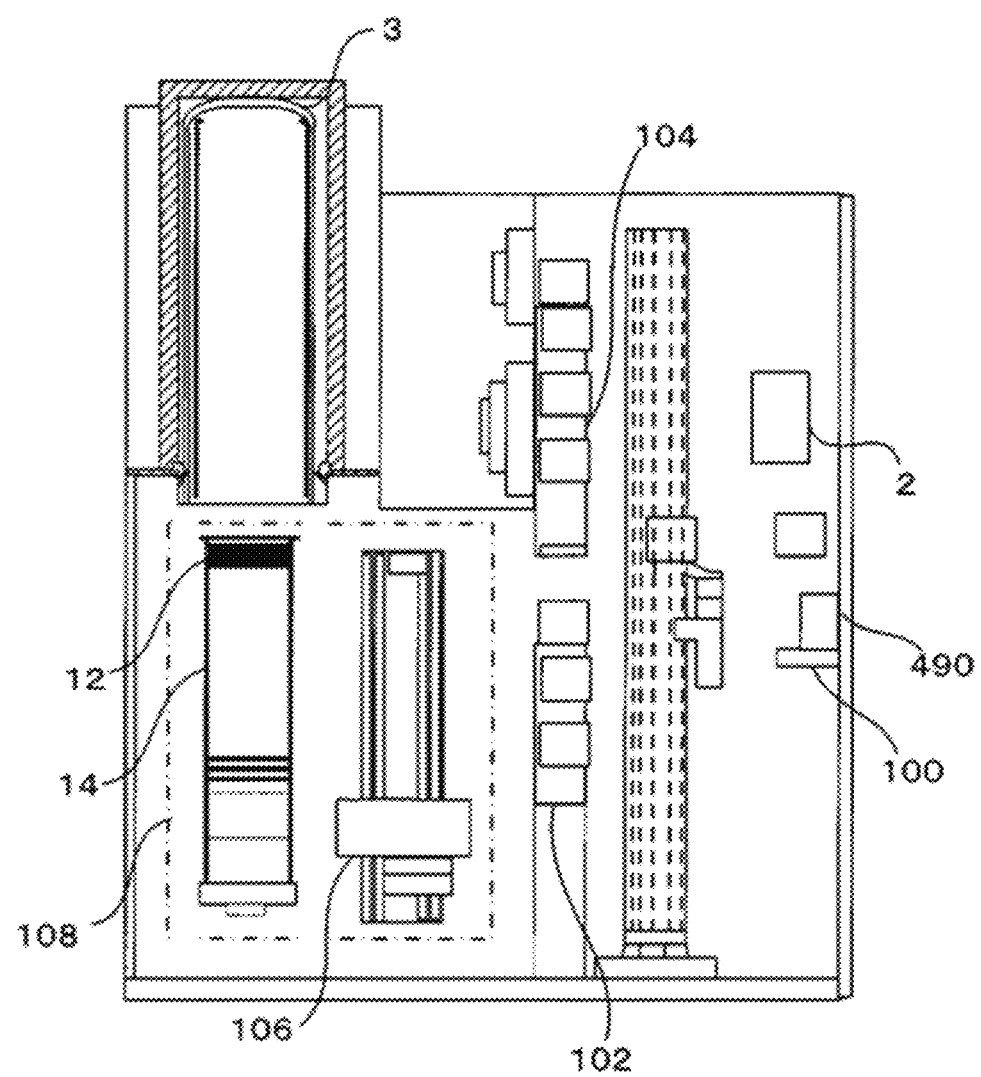
FIG. 1 is a view illustrating an overall configuration of a substrate processing apparatus that is suitably used in a first embodiment of the present disclosure.
Figure 2:
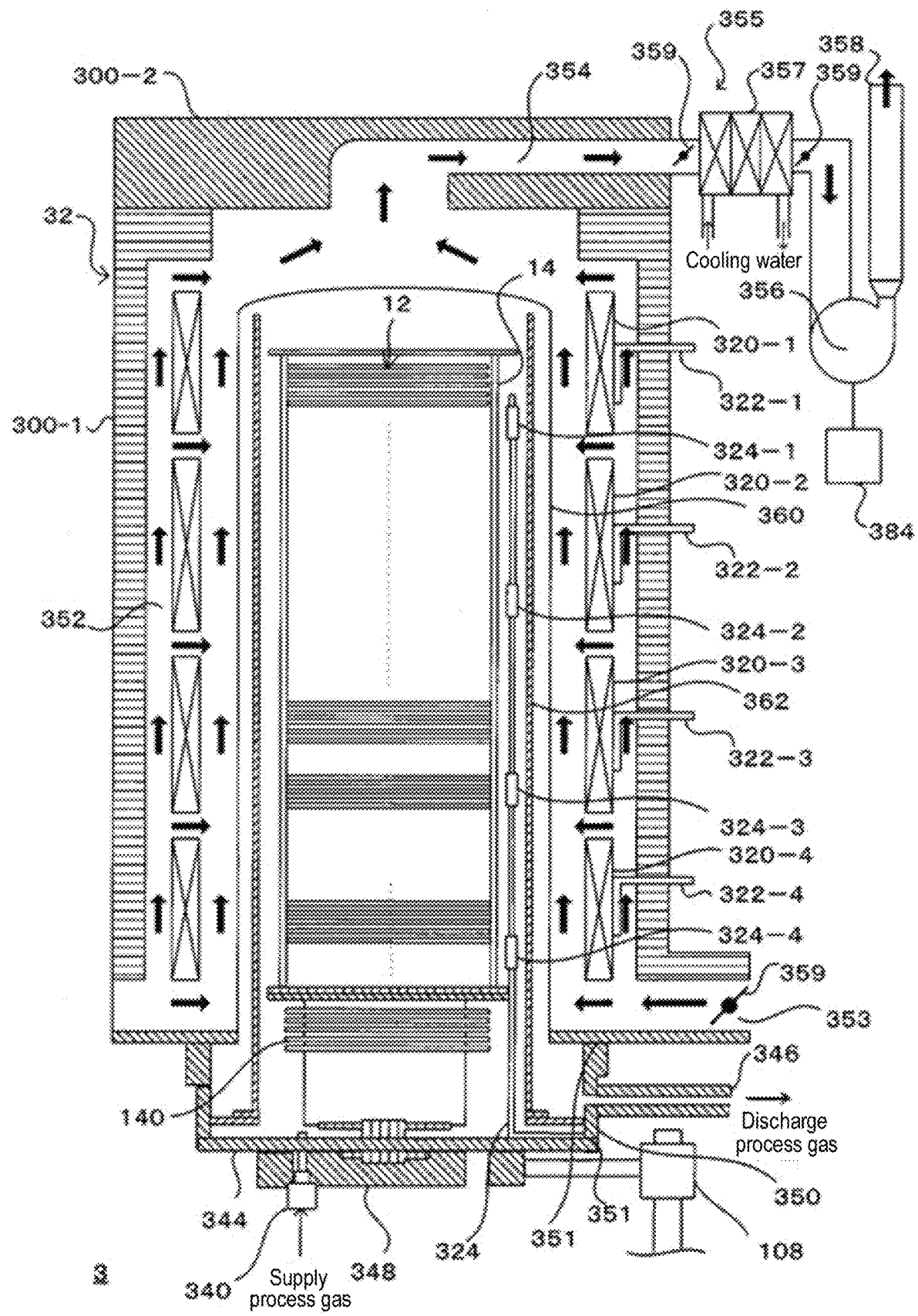
FIG. 2 is a view illustrating a process chamber which accommodates a boat and wafers illustrated in FIG. 1.
Figure 3:
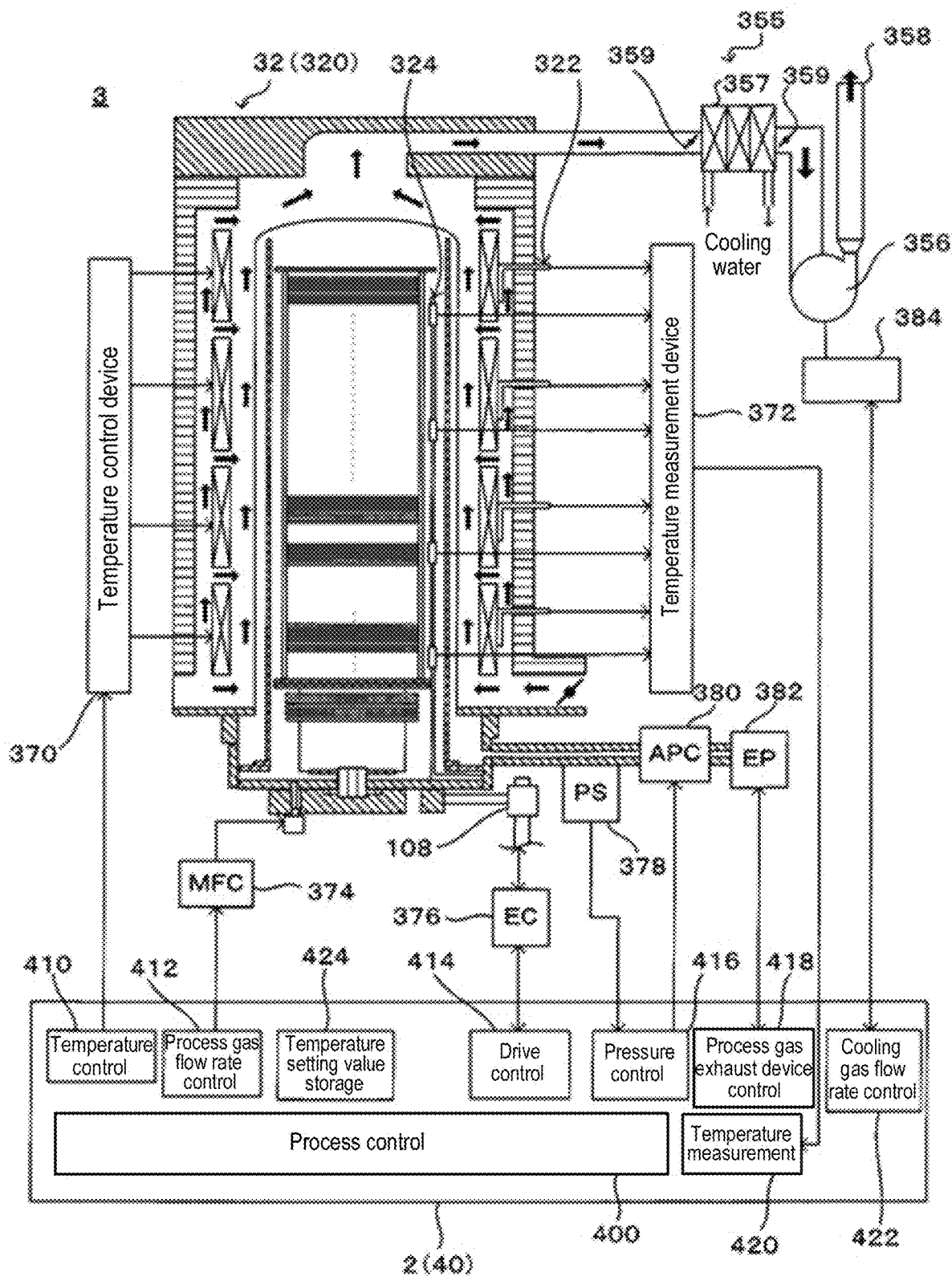
FIG. 3 is a view illustrating peripheral components of the process chamber illustrated in FIG. 1 and a configuration of a control unit (a control program) that controls the process chamber.

FIG. 1 is a view illustrating an overall configuration of a substrate processing apparatus 1 which is suitably used in a first embodiment of the present disclosure. FIG. 2 is a view illustrating a process chamber 3 which accommodates a boat 14 and wafers (or substrates) 12 illustrated in FIG. 1. FIG. 3 is a view illustrating a peripheral configuration of the process chamber 3 that is illustrated in FIG. 1 and a configuration of a control program 40 that controls the substrate processing apparatus 1.

A substrate processing apparatus 1 is a so-called reduced-pressure CVD apparatus that processes, for example, a wafer used in manufacturing a semiconductor device. As illustrated in FIG. 1, the substrate processing apparatus 1 includes a cassette delivery unit 100, a cassette stocker 102 that is installed at a side of a rear surface of the cassette delivery unit 100, a buffer cassette stocker 104 that is installed above the cassette stocker 102, a wafer transfer machine 106 that is installed at a side of a rear surface of the cassette stocker 102, a boat elevator 108 that is installed at a side of a rear surface of the wafer transfer machine 106 and configured to convey the boat 14 on which the wafers 12 are set, a process chamber 3 that is installed above the wafer transfer machine 106, and a control unit 2.

[Process Chamber 3]

As illustrated in FIG. 2, the process chamber 3 includes a hollow heater 32, an outer tube 360, an inner tube 362, a gas supply nozzle 340, a lid member of a furnace port 344, an exhaust pipe 346, a rotation shaft 348, a manifold 350 made of, for example, stainless steel, O-rings 351, a cooling gas flow path 352, an exhaust path 354, an exhaust unit 355, a heat insulator 300-1, and a heat insulator 300-2.

The heater 32 constitutes a heating device and heats the wafers 12, which have been transferred into the process chamber 3, from periphery sides (edge portions) of the wafers 12. The cooling gas flow path 352, the exhaust path 354, and the exhaust unit 355 constitute a cooling device and cool the wafers 12, which have been transferred into the process chamber 3, from the periphery sides (edge portions) of the wafers 12.

The outer tube 360 is made of a light-transmitting material, for example, quartz, and is configured in a cylindrical shape with its lower portion opened. The inner tube 362 is made of a light-transmitting material, for example, quartz, and is configured in a cylindrical shape with its upper and lower portions opened. The inner tube 362 is disposed in the outer tube 360 to be concentric with the outer tube 360. A cylindrical space is formed between the outer tube 360 and the inner tube 362.

The heater 32 includes four temperature control parts 320-1 to 320-4 that individually set and control temperatures. External temperature sensors 322-1 to 322-4, such as thermocouples or the like, are disposed between the temperature control parts 320-1 to 320-4 and the outer tube 360. The external temperature sensors 322-1 to 322-4 are installed at positions corresponding to the temperature control parts 320-1 to 320-4 and are configured to detect the temperatures of the temperature control parts 320-1 to 320-4 or temperatures in the vicinity of the temperature control parts 320-1 to 320-4.

Internal temperature sensors 324-1 to 324-4, such as thermocouples or the like, are disposed in the outer tube 360 (more specifically, in the inner tube 362). The internal temperature sensors 324-1 to 324-4 are installed at positions corresponding to the temperature control parts 320-1 to 320-4 and are configured to detect temperature in the outer tube 360 (more specifically, in the inner tube 362). The detected temperatures by the internal temperature sensors 324-1 to 324-4 are used as values indicative of temperatures of the wafers 12 in heating control, which will be described later. Further, the internal temperature sensors 324-1 to 324-4 may be installed between the inner tube 362 and the outer tube 360. In addition, the internal temperature sensors 324-1 to 324-4 may be bent toward an inner side of the inner tube 362, at positions corresponding to the temperature control parts 320-1 to 320-4, so as to detect temperatures at spaces between the wafers 12 (e.g., a temperature at a region above a center portion of the wafer 12).

Each of the temperature control parts 320-1 to 320-4 of the heater 32 is, for example, an optical heating device and is configured to emit light for optically heating the wafers 12 from a periphery of the outer tube 360. The light emitted from the temperature control parts 320-1 to 320-4 is transmitted through the outer tube 360 and the inner tube 362 and is absorbed by the wafers 12 held in the boat 14. Thus, the wafers 12 are heated from their peripheral sides. Reference numeral 140 indicates a heat insulating plate disposed below the boat 14. The heat insulating plate 140 suppresses heat transfer down the boat 14.

The cooling gas flow path 352 is formed between the heat insulator 300-1 and the outer tube 360 so as to allow fluid such as a cooling gas or the like to pass between the heat insulator 300-1 and the outer tube 360. The cooling gas is supplied from an intake hole 353 formed in a lower end portion of the heat insulator 300-1 and is allowed to flow toward an upper side of the outer tube 360 through the cooling gas flow path 352. The cooling gas may be, for example, air or nitrogen ($N_2$) gas.

Further, the cooling gas flow path 352 is configured such that the cooling gas is injected toward the outer tube 360 from between the temperature control parts 320-1 to 320-4. The cooling gas cools the outer tube 360. The cooled outer tube 360 then cools the wafers 12, which are held in the boat 14, from the periphery sides of the wafers 12. As such, the wafers 12 are cooled from their periphery sides by the cooling gas that passes through the cooling gas flow path 352.

An exhaust path 354 is installed at an upper side of the cooling gas flow path 352 to be used as a cooling gas exhaust path. The exhaust path 354 guides the cooling gas, which has been supplied from the intake hole 353 and flows upward through the cooling gas flow path 352, outside of the heat insulator 300-2.

The exhaust unit 355 is installed in the exhaust path 354. The exhaust unit 355 includes a cooling gas exhaust device 356, implemented with a blower or the like, and a radiator 357. The cooling gas is sucked up by the cooling gas exhaust device 356 and is discharged from an exhaust hole 358 installed at a downstream side of the cooling gas exhaust device 356. The radiator 357 cools, with cooling water or the like, the cooling gas that has been heated as it cools the outer tube 360 and the wafers 12 in the process chamber 3. Shutters 359 are installed in the vicinity of the intake hole 353 and the radiator 357, and are controlled by a shutter control unit (not illustrated) so as to open or close the cooling gas flow path 352 and the exhaust path 354.

As illustrated in FIG. 3, the substrate processing apparatus 1 further includes a temperature control device 370, a temperature measurement device 372, a process gas flow rate control device (a process gas supply unit or a mass flow controller (MFC)) 374, a boat elevator control device (an elevator controller (EC)) 376, a pressure sensor (PS) 378, a pressure regulating device (or an automatic pressure controller (valve) (APC)) 380, a process gas exhaust device (EP) 382, and an inverter 384.

Under the control of the control unit 2, the temperature control device 370 drives each of the temperature control parts 320-1 to 320-4. The temperature measurement device 372 detects the temperature of each of the temperature sensors 322-1 to 322-4 and 324-1 to 324-4, and outputs the detected temperature as a temperature measurement value to the control unit 2.

Under the control of the control unit 2, the boat elevator control device (EC) 376 drives the boat elevator 108. For example, an APC or a $N_2$ ballast controller is used as the pressure regulating device (hereinafter, referred to as an APC) 380. For example, a vacuum pump is used as the EP 382. The inverter 384 controls an operation speed of the cooling gas exhaust device 356 (the revolution-number of a blower).

[Control Unit 2]

Figure 4:
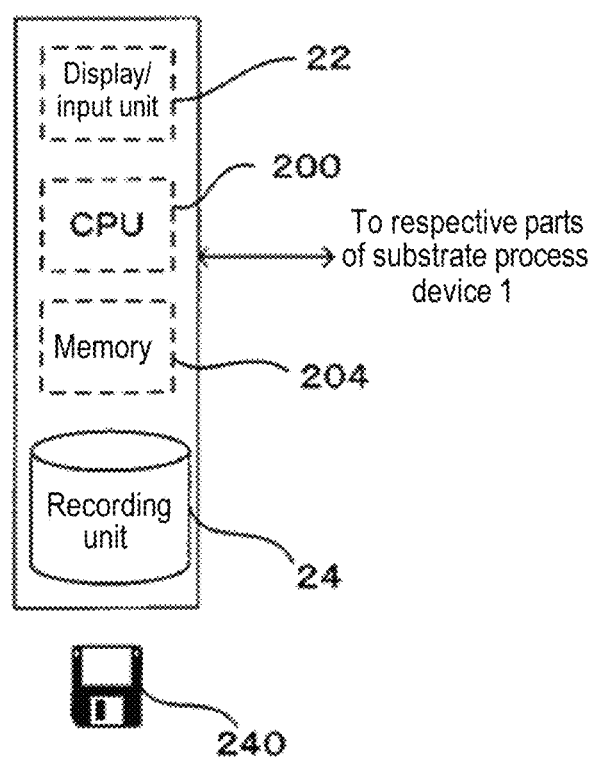
FIG. 4 is a view illustrating a configuration of the control unit illustrated in FIG. 1.

FIG. 4 is a view illustrating a configuration of the control unit 2 illustrated in FIG. 1. As illustrated in FIG. 4, the control unit 2 includes a CPU 200, a memory 204, a display/input unit 22 including a display device, a touch panel, a keyboard, a mouse, etc., and a recording unit 24 such as a HD, a CD, or the like. As such, the control unit 2 includes components as a general computer capable of controlling the substrate processing apparatus 1. Using the components, the control unit 2 executes a control program for a reduced-pressure CVD process (e.g., a control program 40, as illustrated in FIG. 3, including a control of heating or a control of the process gas supply unit, which will be described later) so that each of the components in the substrate processing apparatus 1 is controlled to perform the reduced-pressure CVD process, which will be described later.

[Control Program 40]

Reference is made to FIG. 3 again. As illustrated in FIG. 3, the control program 40 includes a process control unit 400, a temperature control unit 410, a process gas flow rate control unit 412, a drive control unit 414, a pressure control unit 416, a process gas exhaust device control unit 418, a temperature measurement unit 420, a cooling gas flow rate control unit 422, and a temperature setting value storage unit 424. The control program 40 is supplied to the control unit 2, for example, via a recording medium 240 (see FIG. 4). The control program 40 is loaded onto the memory 204 and is executed.

The temperature setting value storage unit 424 stores temperature setting values in a process recipe for the wafers 12 and outputs the temperature setting values to the process control unit 400. The process control unit 400 controls each component in the control program 40, in response to a user's manipulation to the display/input unit 22 (see FIG. 4) of the control unit 2 or pursuant to a process sequence (or the process recipe) recorded in the recording unit 24, so as to perform the reduced-pressure CVD process for the wafers 12, which will be described later.

The temperature measurement unit 420 receives temperature measurement values of the temperature sensors 322 and 324 via the temperature measurement device 372 and outputs the temperature measurement values to the process control unit 400. The temperature control unit 410 controls the heating device based on the temperatures detected by the temperature sensors 322 and 324. Specifically, the temperature control unit 410 receives the temperature setting values and the detected temperatures by the temperature sensors 322-1 to 322-4 and 324-1 to 324-4 from the process control unit 400, and feedback-controls electric power supplied to the temperature control parts 320-1 to 320-4 based on the temperature setting values and the detected temperatures so that an interior of the outer tube 360 is heated for the wafers 12 to reach a desired temperature.

The process gas flow rate control unit 412 controls the MFC 374 and adjusts a flow rate of a process gas or an inert gas supplied into the outer tube 360. The drive control unit 414 controls the boat elevator 108 to move up or down the boat 14 and the wafers 12 held in the boat 14. Furthermore, the drive control unit 414 controls the boat elevator 108 to rotate, via the rotation shaft 348, the boat 14 and the wafers 12 held in the boat 14.

The pressure control unit 416 controls the APC 380, based on a pressure of the process gas in the outer tube 360 detected by the PS 378, to allow the process gas in the outer tube 360 to have a desired pressure. The process gas exhaust device control unit 418 controls the EP 382 to exhaust the process gas or the inert gas existing in the outer tube 360.

The cooling gas flow rate control unit 422 controls operation of the cooling device. Specifically, the cooling gas flow rate control unit 422 controls operation of the cooling gas exhaust device 356 via the inverter 384 so that the flow rate of the cooling gas becomes equal to a predetermined flow rate to allow the wafers 12 to have a desired temperature. Further, the cooling gas flow rate control unit 422 may receive the temperature setting values and the detected temperatures by the temperature sensors 322-1 to 322-4 and 324-1 to 324-4 from the process control unit 400, and may control operation of the cooling gas exhaust device 356 based on the temperature setting values and the detected temperatures.

When it is not necessary to specifically indicate one of the components such as the temperature control parts 320-1 to 320-4 or the like in the following descriptions, the temperature control parts 320-1 to 320-4 may be simply abbreviated as a temperature control part 320. Additionally, although the number of the components such as the temperature control parts 320-1 to 320-4 or the like may be specified in the following descriptions, the number of the components is illustrated for the sake of concrete and clear description and is not intended to limit the technical scope of the present disclosure.

The O-rings 351 are disposed between a lower end of the outer tube 360 and an upper opening portion of the manifold 350 and between the lid member of a furnace port 344 and a lower opening portion of the manifold 350 so as to hermetically seal a gap between the outer tube 360 and the manifold 350. An inert gas or a process gas is supplied into the inner tube 362 through the gas supply nozzle 340 positioned below the outer tube 360.

The exhaust pipe 346 (see FIG. 2) connected to the PS 378, the APC 380, and the EP 382 is installed above the manifold 350. The process gas supplied into the inner tube 362 passes through an interior of the inner tube 362 and then passes through between the outer tube 360 and the inner tube 362. The process gas is discharged out of the process chamber 3 via the exhaust pipe 346, the APC 380, and the EP 382.

When it is required to supply an inert gas to allow an interior of the outer tube 360 to be at a normal pressure, the APC 380 adjusts an internal pressure of the outer tube 360 pursuant to an instruction of the pressure control unit 416 such that the interior of the outer tube 360 is controlled to be at the normal pressure. Alternatively, when it is required to supply a process gas to process the wafers 12, the APC 380 adjusts the internal pressure of the outer tube 360 pursuant to an instruction of the pressure control unit 416 so that the interior of the outer tube 360 is controlled to be of a desired low pressure.

The rotation shaft 348 is connected to a lower portion of the boat 14 that holds the plurality of wafers 12. The rotation shaft 348 is connected to the boat elevator 108 (see FIG. 1). Under the control of the EC 376, the boat elevator 108 moves the boat 14 up or down at a certain speed and rotates the wafers 12 and the boat 14 at a certain speed via the rotation shaft 348.

The wafers 12 used as workpieces are accommodated in a wafer cassette 490 (see FIG. 1). In this state, the wafers 12 are conveyed from the outside of the substrate processing apparatus 1 and are mounted on the cassette delivery unit 100. The cassette delivery unit 100 transfers the wafers 12 to the cassette stocker 102 or the buffer cassette stocker 104. The wafer transfer machine 106 takes out the wafers 12 from the cassette stocker 102 and loads the wafers 12 onto the boat 14 in a horizontal posture and in multiple stages.

The boat elevator 108 moves up the boat 14 with the wafers 12 loaded and transfers the boat 14 into the process chamber 3. In addition, the boat elevator 108 moves down the boat 14 with the processed wafers 12 loaded and takes the boat 14 out of an interior of the process chamber 3. The processed wafers 12 are returned from the boat 14 to the cassette stocker 102 by the wafer transfer machine 106 and are then transferred out of the substrate processing apparatus 1 via the cassette delivery unit 100.

[Temperature of Wafers 12 and Film Thickness]

Figure 5:
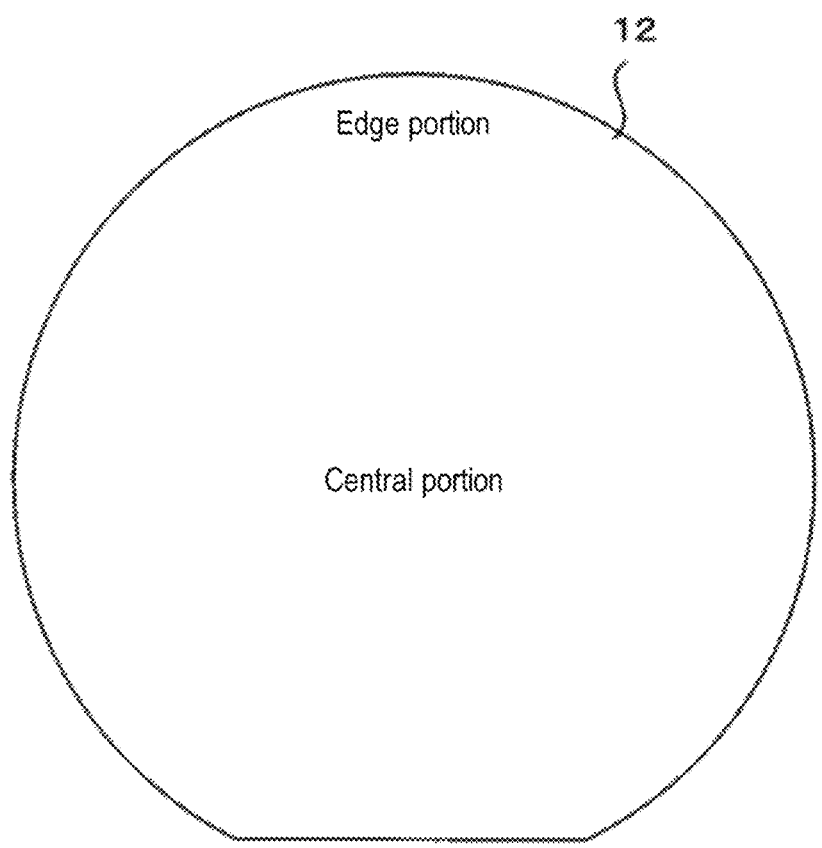
FIG. 5 is a view illustrating a shape of a wafer that is a process target of the substrate processing apparatus illustrated in FIG. 1.

FIG. 5 is a view illustrating a shape of the wafer 12 to be processed in the substrate processing apparatus 1. A surface of the wafer 12 (hereinafter, which may sometimes be simply referred to as the wafer 12) has a substantially circular shape as illustrated in FIG. 5 and is horizontally held in the boat 14.

As described above, the wafer 12 is heated from a periphery of the outer tube 360 by the temperature control parts 320-1 to 320-4. Accordingly, a periphery side of the wafer 12 absorbs a large amount of light. When the cooling gas does not flow through the cooling gas flow path 352, a temperature of the periphery side (edge portion) of the wafer 12 becomes higher than a temperature of a center side (center portion) of the wafer 12. As such, as the wafer 12 is heated by the temperature control parts 320-1 to 320-4, a temperature of the wafer 12 increases from the center portion to the edge portion so as to cause a cone-shaped temperature distribution whose bottom is at the center portion of the wafer 12.

In addition, the process gas such as a reaction gas or the like is supplied from the periphery side of the wafer 12. Therefore, depending on the kind of a film formed on the wafer 12, a reaction speed in the edge portion of the wafer 12 may differ from a reaction speed in the center portion of the wafer 12. For example, the process gas is consumed at the periphery side of the wafer 12 and then flows to the center side of the wafer 12. Thus, a concentration of the process gas at the center side of the wafer 12 is lower than the concentration of the process gas at the periphery side of the wafer 12. Therefore, even if the above temperature distribution is not caused in the surface of the wafer 12, a thickness of a film formed on the wafer 12 may become non-uniform since the process gas is supplied from the periphery side of the wafer 12.

On the other hand, if the cooling gas is allowed to pass through the cooling gas flow path 352, the wafer 12 is cooled from its periphery side as described above. As such, the substrate processing apparatus 1 causes the temperature control part 320 to heat the center side of the wafer 12 to a specified set temperature (a process temperature) and allows the cooling gas to pass through the cooling gas flow path 352 as needed. As a result, different temperatures can be set at the center side and the periphery side of the wafer 12. Therefore, thickness uniformity of a film formed on a substrate can be controlled.

As described above, in the substrate processing apparatus 1, the heating control (the control including heating and cooling) for controlling film thickness is performed depending on a film-forming reaction speed. The control unit 2 controls the heater 32 and the cooling gas exhaust device 356 to perform the heating control.

[Overview of Reduced-Pressure CVD Process Using Substrate Processing Apparatus 1]

Under the control of the control program 40 (see FIG. 3) executed on the control unit 2 (see FIGS. 1 and 4), the substrate processing apparatus 1 employs CVD to form a $Si_3N_4$ film, a $SiO_2$ film, a polysilicon (Poly-Si) film, or the like on the wafers 12 transferred into the process chamber 3.

The film formation using the process chamber 3 is described again. First, the boat elevator 108 moves the boat 14 down. A desired number of wafers 12 as process targets are set in the lowered boat 14. The boat elevator 108 moves the boat 14, in which the wafers 12 are set, into the outer tube 360 (into the inner tube 362). As such, the wafers 12 are transferred into the process chamber 3.

Then, each of four temperature control parts 320-1 to 320-4 of the heater 32 heats the interior of the outer tube 360 under the control of the control unit 2 so that the temperature of the center sides (the center portions) of the wafers 12 reach a predetermined temperature (a process temperature). Additionally, the control unit 2 controls the cooling gas exhaust device 356 to allow the cooling gas to flow through the cooling gas flow path 352. Thus, the wafers 12 are cooled from their periphery sides.

Then, the interior of the outer tube 360 is vacuum-exhausted by the EP 382 to allow the interior of the outer tube 360 to have a desired pressure (vacuum degree). Subsequently, the boat 14 and the wafers 12 held in the boat 14 are rotated via the rotation shaft 348. If the process gas is supplied into the outer tube 360 through the gas supply nozzle 340 in the above state, the process gas supplied as above is moved upward in the inner tube 362 and is uniformly supplied to the respective wafers 12.

The EP 382 exhausts the process gas through the exhaust pipe 346 from the interior of the process chamber 3 which is performing the reduced-pressure CVD process. The APC 380 maintains the process gas in the outer tube 360 to be of a desired pressure. In this manner, the reduced-pressure CVD process is performed on the wafers 12 for a specified period of time.

If the reduced-pressure CVD process is completed, the process gas in the outer tube 360 is replaced with an inert gas and the internal pressure of the outer tube 360 is regulated to a normal pressure so as to proceed to the process for next wafers 12. In addition, the cooling gas is allowed to flow through the cooling gas flow path 352 so that the interior of the outer tube 360 is cooled to a specific temperature. In this state, the boat 14 and the processed wafers 12 held in the boat 14 are moved down by the boat elevator 108 and are unloaded of the process chamber 3.

Further, in some embodiments, the cooling gas is allowed to flow even when the boat 14 is moved into the process chamber 3 and even when the boat 14 is unloaded of the process chamber 3. As a result, the process chamber 3 can be prevented from being filled with heat due to a heat capacity of the process chamber 3 and a temperature of the process chamber 3 can be prevented from fluctuating. Throughput can also be improved.

In the film forming process as described above, if the heating control is performed by the cooling gas so that a temperature difference is generated between the temperature of the periphery side and the temperature of the center side of the wafer 12 while the heater 32 is controlled to maintain the temperature of the center side of the wafer 12 at a preset temperature, in-plane film thickness uniformity of the wafer 12 and inter-plane film thickness uniformity can be improved without changing film quality. For example, in the case of forming a CVD film such as a $Si_3N_4$ film or the like, if a film-forming process is performed while a process temperature changes in a wide range, a refractive index of the film may change depending on the process temperature. If the film-forming process is performed while the process temperature is lowered from a high temperature to a low temperature, the film may change from a film having a low etching rate to a film having a high etching rate depending on the process temperature. Further, in the case of forming the $Si_3N_4$ film, if the film-forming process is performed while the process temperature is lowered from a high temperature to a low temperature, the film may change from a film having a high stress value to a film having a low stress value depending on the process temperature.

Accordingly, the substrate processing apparatus 1 controls an in-plane temperature distribution of the wafer 12 by controlling an amount of heat that is generated by the temperature control part 320 and a flow rate of the cooling gas that passes through the cooling gas flow path 352. As a result, the thickness uniformity of the film formed on the wafer 12 can be controlled without changing film quality.

Subsequently, a heating control and a process gas supply control are described below in detail. The control unit performs the heating control and the process gas supply control.

Figure 6:
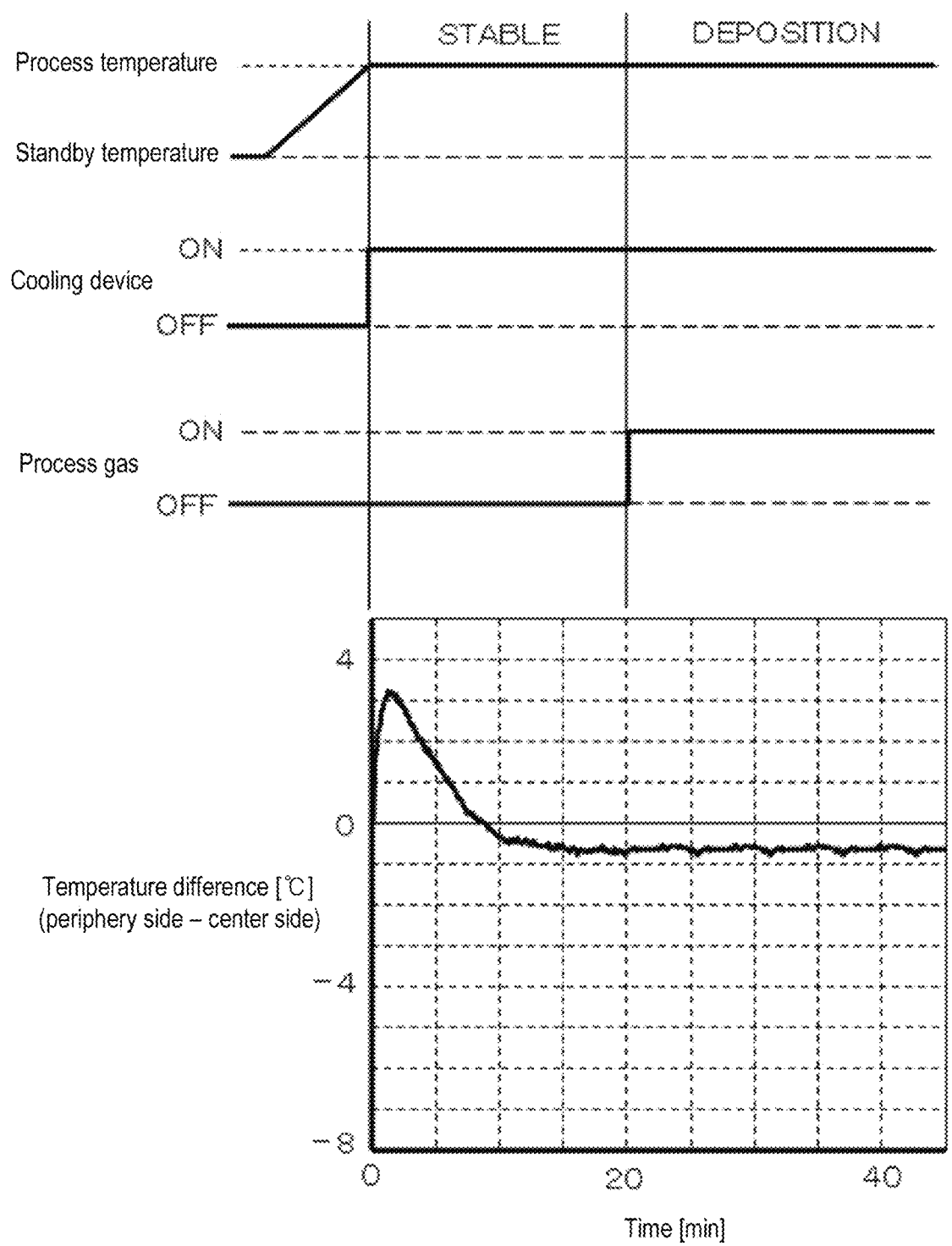
FIG. 6 is a timing chart illustrating an example of a heating control and a process gas supply control of the substrate processing apparatus according to the first embodiment of the present disclosure.

FIG. 6 is a timing chart illustrating an example of the heating control and the process gas supply control for the substrate processing apparatus 1 according to the first embodiment of the present disclosure. As illustrated in FIG. 6, the control unit 2 first controls operation of the heating device (specifically, the temperature control part 320 in the heater 32) such that a temperature detected by the internal temperature sensor 324 is increased from a specific standby temperature to a specific process temperature (a preset temperature). Thus, a temperature of the center side of the wafer 12 is increased to the process temperature. In addition, although the detected temperature by the internal temperature sensor 324 and the temperature of the center side of the wafer 12 may not be strictly identical to each other, a correlation between the detected temperature by the internal temperature sensor 324 and the temperature of the center side of the wafer 12, when the amount of the heat generated by the temperature control part 320 and the flow rate of the cooling gas are set to be proper values, may be found in advance, and the temperature of the center side of the wafer 12 may be controlled to be a specific temperature based on the detected temperature by the internal temperature sensor 324. For ease of understanding, the detected temperature by the internal temperature sensor 324 is regarded as the temperature of the center side of the wafer 12 in the following descriptions.

If the temperature detected by the internal temperature sensor 324 reaches the process temperature (if the temperature of the center side of the wafer 12 reaches the process temperature), the control unit 2 starts operation of the cooling device (specifically, the control unit 2 operates the cooling gas exhaust device 356 to allow the cooling gas to flow through the cooling gas flow path 352 at a predetermined flow rate). If the operation of the cooling device is started, the wafer 12 is cooled from its periphery side. The temperature of the center side of the wafer 12 is maintained at the process temperature by controlling the heating device such that the temperature detected by the internal temperature sensor 324 becomes equal to the process temperature. Here, by the cooling gas flowing through the cooling gas flow path 352, the temperature of the periphery side of the wafer 12 is maintained at a specific temperature lower than the temperature of the center side of the wafer 12.

If the temperature detected by the internal temperature sensor 324 is stabilized at the process temperature (if the temperature of the center side and the temperature of the periphery side of the wafer 12 are stabilized at preset temperatures, respectively, and, specifically, if the temperature of the center side is stabilized with a specific temperature difference from the temperature of the periphery side of the wafer 12), the control unit 2 operates the process gas flow rate control device (MFC) 374 and starts the supply of the process gas into the process chamber 3 (the interior of the outer tube 360). The time taken from the start of the operation of the cooling device to the start of the supply of the process gas (the period indicated as "STABLE" in FIG. 6 may be determined in advance, for example, based on experiments.

In the lower portion of FIG. 6, there is illustrated a change in the temperature difference between the center side and the periphery side of the wafer 12 (a change in the value obtained by subtracting the temperature of the center side from the temperature of the periphery side of the wafer 12). As illustrated, during a process period (a supply period of the process gas, (which is the period indicated as "DEPOSITION" in FIG. 6), the temperature of the periphery side of the wafer 12 is maintained to be lower than the temperature of the center side by a specific temperature.

As described above, if the process gas is supplied from the periphery side of the wafer, the process gas is consumed at the periphery side of the wafer and then flows to the center side of the wafer. Thus, the concentration of the process gas at the center side of the wafer may be lower than the concentration of the process gas at the periphery side of the wafer. In this case, a film thickness at the center side of the wafer may become smaller than a film thickness at the periphery side of the wafer. In contrast, according to the first embodiment of the present disclosure, during the supply period of the process gas, the control unit 2 controls the heating device and the cooling device to maintain the temperature of the periphery side of the wafer to be lower than the temperature of the center side of the wafer by a specific temperature difference. As a result, film formation at the periphery side of the wafer is suppressed. It is, therefore, possible to make the thickness of the film formed on the wafer uniform.

Second Embodiment

Next, a second embodiment of the present disclosure is described below.

In the first embodiment as described above, during the supply period of the process gas, the temperature of the periphery side of the wafer is maintained to be lower than the temperature of the center side of the wafer by a specific temperature difference so as to make the thickness of the film formed on the wafer uniform. In this case, if it is intended to increase the temperature difference between the periphery side and the center side of the wafer (if it is intended to decrease the temperature of the periphery side of the wafer to be lower than the temperature of the center side of the wafer), it may be considered to improve a cooling performance of the cooling device. However, if the cooling performance of the cooling device is enhanced, the load of the heating device for maintaining the temperature of the center side of the wafer constant is increased. Thus, according to the second embodiment of the present disclosure, the heating control and the process gas supply control are improved such that a large temperature difference can be generated between the center side and the periphery side of the wafer without enhancing the cooling performance of the cooling device.

Figure 7:
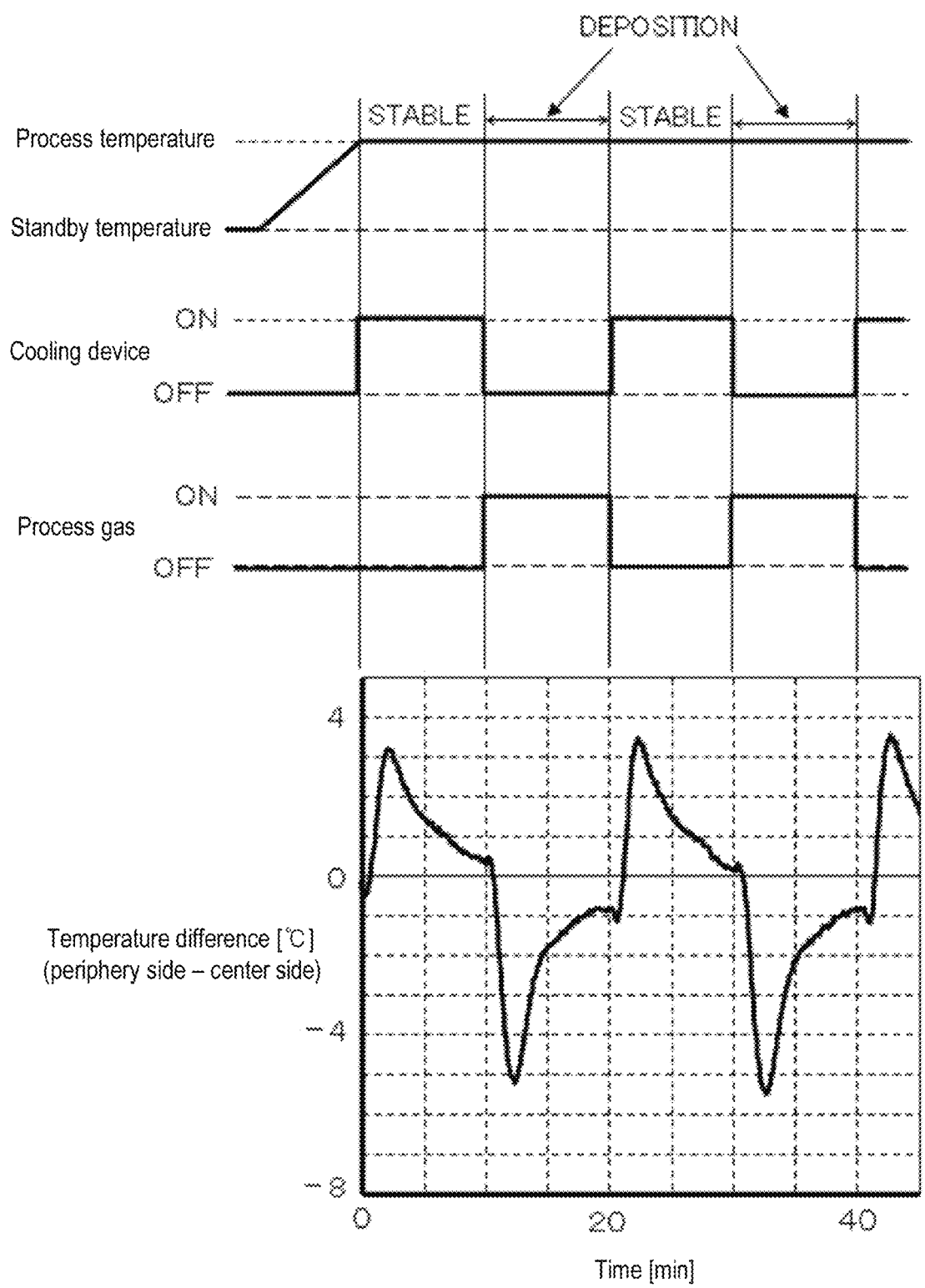
FIG. 7 is a timing chart illustrating an example of a heating control and a process gas supply control of a substrate processing apparatus according to a second embodiment of the present disclosure.

FIG. 7 is a timing chart illustrating an example of a heating control and a process gas supply control for the substrate processing apparatus 1 according to the second embodiment of the present disclosure. Since the configuration of the substrate processing apparatus 1 according to the second embodiment is the same as the configuration of the substrate processing apparatus 1 according to the first embodiment, the descriptions for the substrate processing apparatus 1 are omitted.

As illustrated in FIG. 7, the control unit 2 first controls operation of the temperature control part 320 of the heating device (the heater 32) so that the temperature detected by the internal temperature sensor 324 is increased from a standby temperature to a process temperature. As a result, the temperature of the center side of the wafer 12 is increased to the process temperature. If the temperature detected by the internal temperature sensor 324 reaches the process temperature (if the temperature of the center side of the wafer 12 reaches a set temperature), the control unit 2 starts operation of the cooling device. The above procedures are the same as those described with reference to the first embodiment.

In the second embodiment of the present disclosure, if the temperature detected by the internal temperature sensor 324 is stabilized at the process temperature (if the temperature of the center side of the wafer 12 is stabilized at the process temperature), the control unit 2 stops operating the cooling device and operates the process gas flow rate control device 374 so that the supply of the process gas into the process chamber 3 (the interior of the outer tube 360) is started.

Figure 8:
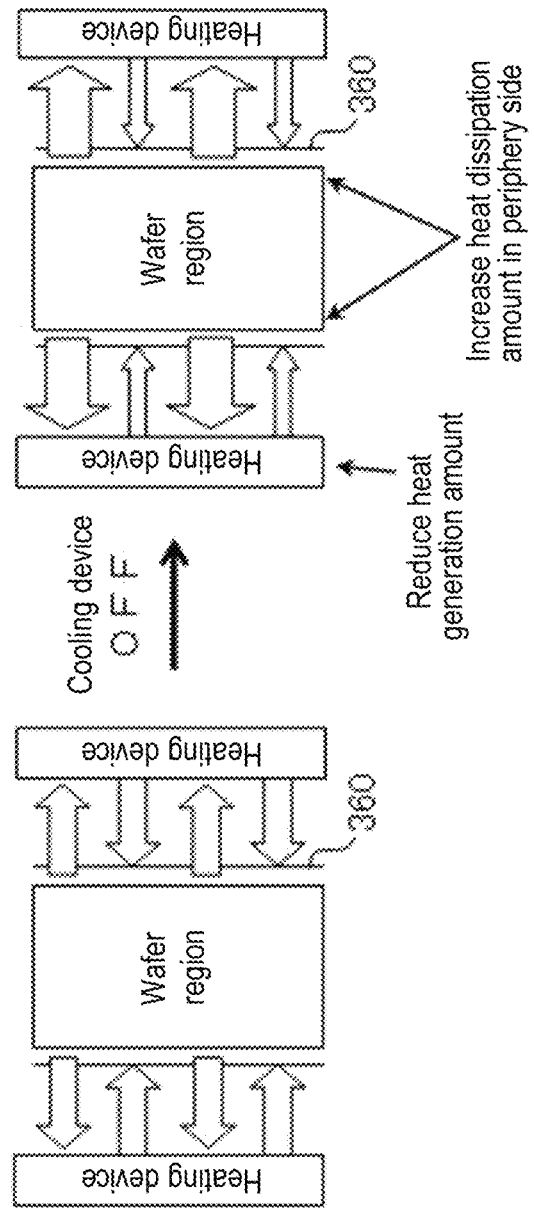
FIG. 8 is a view illustrating heat transfer of an outer tube when operation of a cooling device is stopped.

As illustrated in the lower portion of FIG. 7, the temperature difference between the center side and the periphery side of the wafer 12 remains large over a certain time period after the operation of the cooling device is stopped. This means that the temperature of the periphery side of the wafer 12 is largely decreased when compared to the temperature of the center side of the wafer 12. As such, if the operation of the cooling device is stopped from the operating state, the temperature of the periphery side of the wafer is temporarily decreased faster than the temperature of the center side of the wafer. The reason is as follows. First, if the operation of the cooling device is stopped, the temperature of the interior of the process chamber 3 (the interior of the outer tube 360) is going to rise. Then, the heating device is controlled to stop its operation or reduce its output (a heat generation amount). As illustrated in FIG. 8, if the heat generation amount of the heating device is reduced, heat transfer from the outer tube 360 to its outside is increased and a heat radiation amount from the periphery side of the wafer 12 is increased. Therefore, after the cooling device is stopped, the temperature of the periphery side of the wafer is temporarily decreased faster than the temperature of the center side of the wafer.

Accordingly, in the second embodiment, the control unit 2 stops the operation of the cooling device when the supply of the process gas into the process chamber 3 is started by operating the process gas flow rate control device 374. As a result, the temperature of the periphery side of the wafer 12 can be lowered more drastically than the temperature of the center side of the wafer 12 without having to enhance the cooling performance of the cooling device. Thus, a larger temperature difference can be caused between the center side and the periphery side of the wafer 12. Accordingly, thickness uniformity of a film formed on the wafer can be controlled efficiently and to the film thickness uniformity can be further improved.

Reference is made to FIG. 7 again. In the following descriptions, the control of operating both the heating device and the cooling device (the control of both heating the wafer from its periphery side by using the heating device and cooling the wafer by using the cooling device) will be referred to as "first control." The control of stopping operation of at least the cooling device after the first control will be referred to as "second control."

[Start Timing of Second Control]

As can be noted from a comparison of FIGS. 6 and 7, in the first embodiment as described above, the supply of the process gas is started after the temperature of the periphery side of the wafer 12 is decreased to be lower than the temperature of the center side of the wafer 12 by a specific temperature. In the second embodiment, the second control is started and the supply of the process gas is started before the temperature of the periphery side of the wafer 12 decreases to be lower than the temperature of the center side of the wafer 12. This is because in the second embodiment, the temperature of the periphery side of the wafer 12 can be effectively reduced by executing the second control.

As such, in the second embodiment, an execution time period of the first control is set to be a predetermined time period (a time period in which the temperature difference between the center side and periphery side of the wafer 12 reaches a specific temperature by the first control while the temperature of the center side of the wafer 12 is maintained at a specific temperature). After the first control is executed for the time period, the second control is started.

Further, in the second embodiment, the second control is started before the temperature of the periphery side of the wafer 12 decreases to be lower than the temperature of the center side of the wafer 12. Thus, in the second embodiment, a cooling device, whose cooling performance is lower than that of the cooling device used in the first embodiment, may be employed. In addition, in the second embodiment, the cooling device is not operated continuously for a long period of time. Thus, the load of the heating device due to the cooling is reduced. Accordingly, contrary to the above descriptions, the cooling performance of the cooling device can be improved and the periphery side of the wafer 12 can be cooled in a short period of time. As a result, the execution time period of the first control can be shortened. Moreover, the second control may be executed after the temperature of the periphery side of the wafer 12 decreases to be lower than the temperature of the center side of the wafer 12. Similar to the first embodiment, the second control may be executed after the temperature difference between the temperature of the periphery side of the wafer 12 and the temperature of the center side of the wafer 12 is stabilized.

[Execution Time Period of Second Control]

As illustrated in FIG. 7, the second control is executed for a specific period of time after the first control. During the execution of the second control, the process gas flow rate control device 374 is operated to supply the process gas to the process chamber 3.

The execution time period of the second control is determined in advance based on experiments or the like. Although operation of the cooling device is stopped, temperature in the outer tube 360 decreases due to natural heat dissipation. Thus, the control unit 2 controls the heating device so that the temperature detected by the internal temperature sensor 324 is maintained to be the process temperature. As described above, the heating device heats the wafer 12 from its periphery side. Therefore, while the cooling device is stopped, the temperature of the wafer 12 is more easily increased at its periphery side than at its center side. Accordingly, when the time period, in which the temperature of the periphery side of the wafer decreases faster than the temperature of the center side of the wafer, is elapsed after the cooling device is stopped, the temperature difference between the center side and the periphery side becomes smaller. Eventually, the temperature of the periphery side exceeds the temperature of the center side. Thus, the time period, in which a difference equal to or larger than a specific temperature can be generated between the center side and the periphery side of the wafer 12, namely, the time period, in which the temperature of the periphery side can be maintained to be lower than the temperature of the center side by a specific temperature or more, is measured in advance by experiments or the like. The time period as measured above is set as the execution time period of the second control.

If a desired thickness for a film cannot be formed during the execution time period of the second control, that is, if the execution time period of the second control fails to meet a specific process time period, the supply of the process gas is stopped and the cooling device is operated again to execute to the first control. Thereafter, the operation of the cooling device is stopped again to execute the second control and the supply of the process gas is performed. In this manner, a specific process time period can be secured by alternately and repeatedly executing the first control and the second control a predetermined number of times.

In FIG. 7, a start timing of the second control (a timing at which the operation of the cooling device is stopped) and a start timing of the supply of the process gas are brought into coincidence with each other. An end timing of the second control 7 (a timing at which the operation of the cooling device is resumed) and an end timing of the supply of the process gas are brought into coincidence with each other. However, the process gas needs to be supplied at least for a certain period of time while the second control is performed. Accordingly, for example, the start timing of the supply of the process gas may be set to be later than the start timing of the second control. Furthermore, the end timing of the supply of the process gas may be set to be earlier than the end timing of the second control. As such, if the process gas is supplied for a specified time period while the second control is executed at least after the first control is switched to the second control, efficient cooling effect for the periphery side of the wafer by using the second control can be achieved. However, to secure a process time period, the execution time period of the second control and the supply time of the process gas can be brought into coincidence with each other.

Third Embodiment

Next, a third embodiment of the present disclosure is described below.

Figure 9:
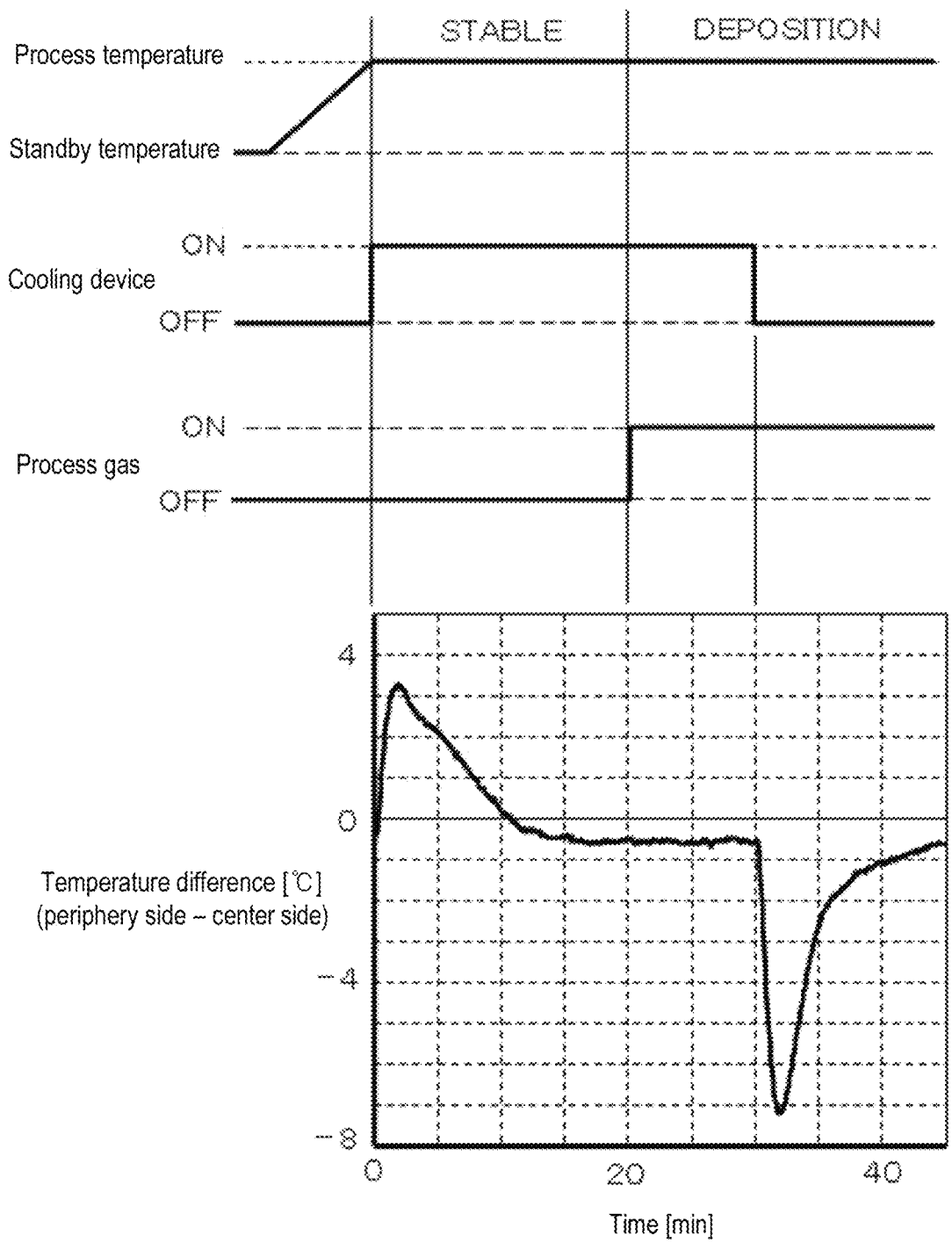
FIG. 9 is a timing chart illustrating an example of a heating control and a process gas supply control of a substrate processing apparatus according to a third embodiment of the present disclosure.

FIG. 9 is a timing chart illustrating an example of a heating control and a process gas supply control for the substrate processing apparatus 1 according to a third embodiment of the present disclosure. Since the configuration of the substrate processing apparatus 1 according to the third embodiment is the same as the configuration of the substrate processing apparatus 1 according to the first embodiment, the descriptions for the substrate processing apparatus 1 are omitted.

In the third embodiment, as shown in FIG. 9, the second control is executed after the temperature of the periphery side of the wafer 12 becomes lower than the temperature of the center side by a specific temperature over the first control while the temperature of the center side of the wafer 12 is maintained at a specific temperature. While the first control is executed (specifically, when the temperature of the periphery side of the wafer 12 is stabilized at a temperature that is lower than the temperature of the center side by a specific temperature while the temperature of the center side of the wafer 12 is maintained at a specific temperature), the process gas flow rate control device 374 is operated so as to start the supply of the process gas into the process chamber 3. As such, in the third embodiment, after the first control is executed, operation of the cooling device is stopped while the process gas is supplied. In other words, the operation of the cooling device is stopped only for a specified time period in the wafer process time period (the time period of the supply of the process gas).

As illustrated in FIG. 9, the control unit 2 first controls operation of the heating device (the temperature control part 320 of the heater 32) so that the temperature detected by the internal temperature sensor 324 is increased from a standby temperature to a process temperature. As a result, the temperature of the center side of the wafer 12 is increased to the process temperature. If the temperature detected by the internal temperature sensor 324 reaches the process temperature (if the temperature of the center side of the wafer 12 reaches the process temperature), the control unit 2 starts the operation of the cooling device (starts the first control). The procedures described above are the same as the procedures of the aforementioned embodiments.

If a predetermined time period (specifically, a time period in which the temperature of the periphery side of the wafer 12 is stabilized at a temperature that is lower than the temperature of the center side by a specific temperature while the temperature of the center side of the wafer 12 is maintained at the process temperature) is elapsed, the process gas flow rate control device 374 is operated to start the supply of the process gas into the process chamber 3 (the interior of the outer tube 360).

Subsequently, when the process gas has been supplied for a specified time period, the control unit 2 stops the operation of the cooling device (starts the second control) while the process gas is supplied continuously. As illustrated in the lower portion of FIG. 9, although the temperature of the periphery side of the wafer 12 had been maintained to be lower than the temperature of the center side by a specific temperature, if the operation of the cooling device is stopped, the temperature of the periphery side of the wafer 12 is decreased more sharply than the temperature of the center side for a specified time as described above with reference to the second embodiment. As a result, the temperature of the periphery side of the wafer 12 can be decreased more sharply than the temperature of the center side without having to enhance the cooling performance of the cooling device. Thus, a larger temperature difference can be caused between the center side and the periphery side of the wafer 12. Accordingly, thickness uniformity of the film formed on the wafer can be controlled effectively and the film thickness uniformity can be improved.

[Start Timing of Second Control]

The start timing of the second control in the third embodiment is determined, for example, in the following manner.
(1) The Case where the First Control and the Second Control are Executed for Only One Cycle If executing the first control and the second control for one cycle satisfies a desired process time period, the second control is started at a timing which precedes an end timing of the desired process time period by a time period in which the cooling effect for the periphery portion of the wafer can be obtained through the second control ([the execution time period of the second control] described above with reference to the second embodiment). The supply of the process gas is continuously performed until the second control comes to an end.

(2) The Case where the First Control and the Second Control are Executed a Plurality of Cycles The second control is started at a timing which precedes an end timing of the process time period for one cycle by a time period in which the cooling effect for the periphery portion of the wafer can be obtained through the second control ([the execution time period of the second control] described above with reference to the second embodiment). After the second control is completed, the operation of the cooling device is resumed to execute the first control. The supply of the process gas is continuously performed until the second control comes to an end and is completed simultaneously with the end of the second control. If a predetermined time period (specifically, a time period in which the temperature of the periphery side of the wafer 12 is stabilized at a temperature lower than the temperature of the center side by a specific temperature while the temperature of the center side of the wafer 12 is maintained at a specific temperature) elapses after the first control is resumed, the supply of the process gas is started again. Thereafter, the same procedures are performed a predetermined number of cycles.

In each of cases (1) and (2) as described above, the supply of the process gas may be ended within the second control. Additionally, the supply of the process gas may be continuously performed when the second control is switched to the first control.

In the third embodiment, thickness uniformity of the film formed on the wafer can be effectively controlled while the wafer process conditions of the first embodiment are used.

Thus, the film thickness uniformity can be further improved. Similar to the second embodiment, the process time period per one cycle is not limited to the execution time period of the second control. Therefore, the process time period for one cycle can be set to be an optimal time period which realizes a desired process time period.

Fourth Embodiment

Next, a fourth embodiment of the present disclosure is described below.

[Exhaust Pressure and Film Thickness]

As described above, when a film is formed on the wafer 12 in the substrate processing apparatus 1, the heating control is executed by at least one of the control, in which the control unit 2 controls the temperature control part 320 of the heater 32 based on a measurement value of the internal temperature sensor 324, and the control, in which the control unit 2 controls the cooling gas exhaust device 356 by using the cooling gas flow rate control unit 422 and the inverter 384. When a cooling gas is allowed to flow through the cooling gas flow path 352, the cooling gas moves through the cooling gas flow path 352 and the exhaust path 354 to be exhausted from the exhaust hole 358 by the exhaust unit 355. The exhaust hole 358 is connected to an exhaust facility of a factory or the like, not illustrated in the drawings.

An exhaust pressure of the exhaust facility is affected by conductance attributable to a length of a pipe between the exhaust facility and the exhaust hole 358, a shape of the pipe, a route of the piping route, and the like, or affected by the number of the devices connected to the exhaust facility and the like. Thus, exhaust pressures of all the exhaust facilities are different from each other and the exhaust pressure may vary even in the same exhaust facility. If the facility pressure of the exhaust facility changes, an amount of the gas flowing through the cooling gas flow path 352 changes even though the cooling gas exhaust device 356 is controlled with a constant control value. For example, if it is assumed that the facility exhaust pressure decreases from 200 Pa to 150 Pa, a flow rate of the cooling gas flowing through the cooling gas flow path 352 decreases. On the other hand, if it is assumed that the facility exhaust pressure increases from 150 Pa to 200 Pa, the flow rate of the cooling gas flowing through the cooling gas flow path 352 increases.

If a cooling performance varies with the change in the exhaust pressure of the exhaust facility as described above, variation of the cooling performance may affect thickness uniformity of a film formed on the wafer 12.

Accordingly, in the fourth embodiment, an attempt is made to ensure that a thickness of a film formed on the wafer 12 can be made uniform even if there is a variation or a change in the exhaust pressure of the facility.

Figure 10:
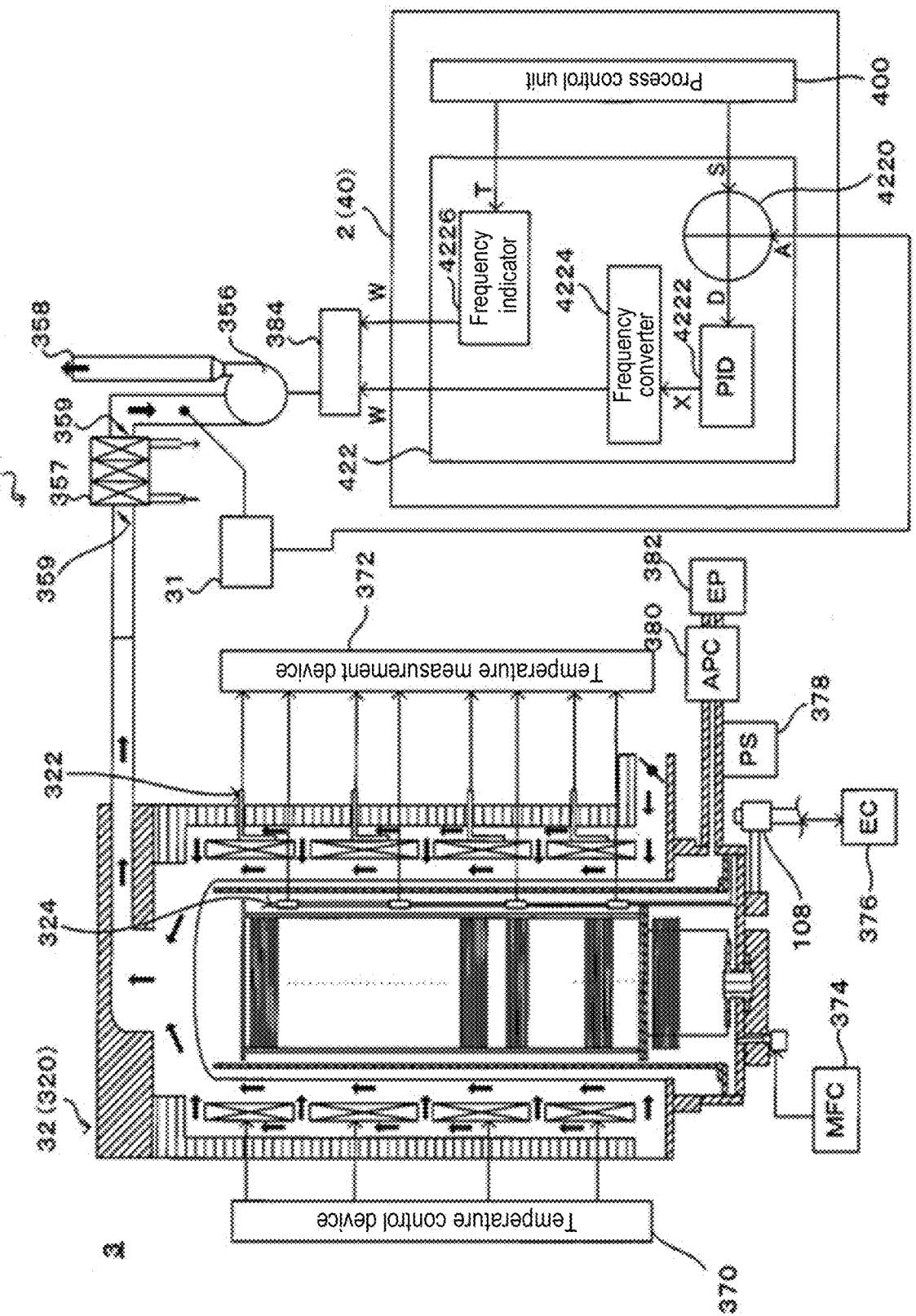
FIG. 10 is a view illustrating a configuration of a substrate processing apparatus according to a fourth embodiment of the present disclosure.

FIG. 10 is a view illustrating a configuration of a substrate processing apparatus according to the fourth embodiment of the present disclosure. The substrate processing apparatus according to the fourth embodiment of the present disclosure includes not only the components of the substrate processing apparatus 1 in the first embodiment but also its own components for making the film thickness of the wafer 12 uniform even if there is a variation or a change in the exhaust pressure of the facility. Some of the components identical with those of the substrate processing apparatus 1 in the first embodiment are neither illustrated nor described.

As illustrated in FIG. 10, in the substrate processing apparatus, a pressure sensor 31 for detecting an internal pressure of a pipe is installed in a pipe which interconnects the cooling gas exhaust device 356 and the radiator 357 of the exhaust unit 355. The pressure sensor 31 may be installed at a position close to the radiator 357 in the pipe which interconnects the cooling gas exhaust device 356 and the radiator 357. By installing the pressure sensor 31 at the position close to the radiator 357, a pressure loss can be prevented from being caused in the cooling gas between the radiator 357 and the pressure sensor 31 under the influence of a length of the pipe, a route of the pipe, a shape of the pipe, etc.

Similar to the substrate processing apparatus 1 described above with reference to the first embodiment, the control program 40 includes the process control unit 400, the temperature control unit 410, the process gas flow rate control unit 412, the drive control unit 414, the pressure control unit 416, the process gas exhaust device control unit 418, the temperature measurement unit 420, the cooling gas flow rate control unit 422, and the temperature setting value storage unit 424. In FIG. 10, there are illustrated the process control unit 400 and the cooling gas flow rate control unit 422. The temperature control unit 410, the process gas flow rate control unit 412, the drive control unit 414, the pressure control unit 416, the process gas exhaust device control unit 418, the temperature measurement unit 420 and the temperature setting value storage unit 424 are not shown in FIG. 10. Similar to the substrate processing apparatus 1 described in the first embodiment, the control program is supplied to the control unit 2 via, for example, the recording medium 240 (see FIG. 4), loaded onto the memory 204, and executed.

The cooling gas flow rate control unit 422 includes a subtractor 4220, a PID computing unit 4222, a frequency converter 4224, and a frequency indicator 4226. A pressure target value S is inputted from the process control unit 400 to the subtractor 4220. In this regard, the pressure target value S is set in advance such that the center side of the wafer 12 is maintained at a process temperature and the periphery side of the wafer 12 is maintained at a temperature lower than the process temperature. In addition to the pressure target value S, a pressure value A measured by the pressure sensor 31 is inputted to the subtractor 4220. The subtractor 4220 outputs a deviation D which is obtained by subtracting the pressure value A from the pressure target value S.

The deviation D is inputted to the PID computing unit 4222. In the PID computing unit 4222, PID computation is performed based on the input deviation D and an operation amount X is calculated. The calculated operation amount X is inputted to the frequency converter 4224 and is converted to a frequency W in the frequency converter 4224. The frequency W is outputted from the frequency converter 4224. The outputed frequency W is inputted to the inverter 384 so that the frequency of the cooling gas exhaust device 356 (the revolution-number of a blower) is changed.

The pressure value A from the pressure sensor 31 is inputted to the subtractor 4220 either at all times or at a specified time interval. Based on the pressure value A, the control of the frequency of the cooling gas exhaust device 356 is continuously executed such that the deviation D between the pressure target value S (the pressure target value in an upstream position of the exhaust path 354, specifically, the cooling gas exhaust device 356) and the pressure value A becomes 0. In this manner, the frequency of the cooling gas exhaust device 356 is controlled via the inverter 384 so that the deviation D between the pressure value A measured by the pressure sensor 31 and the predetermined pressure target value S is eliminated. As such, the frequency controlled so as to eliminate the deviation D is feedback-controlled as the frequency for the case where the deviation is 0. Based on the value after the feedback, the cooling gas flow rate control unit 422 controls the flow rate of the cooling gas.

Instead of computing the frequency W in the PID computing unit 4222, the frequency of the cooling gas exhaust device 356 may be changed by inputting a frequency setting value T from the process control unit 400 to the frequency indicator 4226 and inputting a frequency W from the frequency indicator 4226 to the inverter 384. The frequency setting value T may be changed by allowing a user to manipulate the display/input unit 22 (see FIG. 4).

By performing the aforementioned control, the thickness of the film formed on the wafer 12 can be prevented from being non-uniform due to the change in the flow rate of the cooling medium flowing through the cooling gas flow path 352, even if there is a variation or a change in the exhaust pressure of the facility connected to the exhaust hole 358.

In the substrate processing apparatus according to the fourth embodiment, the same control as used in the first embodiment, the second embodiment, and the third embodiment is applied to the heating control and the process gas supply control executed by the control unit 2. Thus, in the fourth embodiment, it is possible to obtain the same effects as described in the first embodiment, the second embodiment, and the third embodiment, even if there is a variation or a change in the exhaust pressure of the facility connected to the exhaust hole 358.

Fifth Embodiment

Next, a fifth embodiment of the present disclosure is described below.

Figure 11:
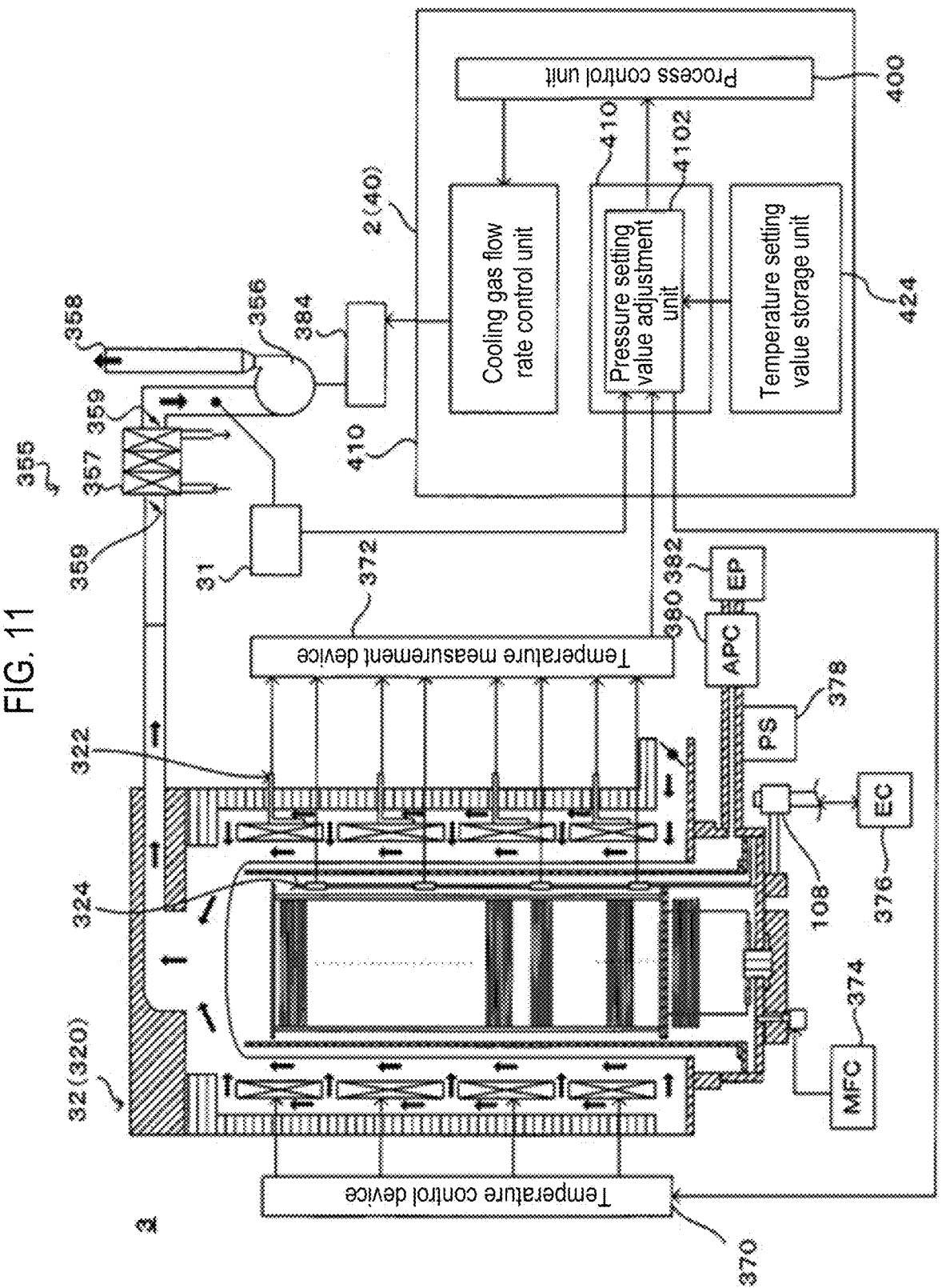
FIG. 11 is a view illustrating a configuration of a substrate processing apparatus according to a fifth embodiment of the present disclosure.

FIG. 11 is a view illustrating a configuration of a substrate processing apparatus according to a fifth embodiment of the present disclosure. In the substrate processing apparatus according to the fourth embodiment s described above, the control unit 2 controls the cooling gas exhaust device 356 based on the pressure value detected by the pressure sensor 31 used as a pressure detector. In contrast, the substrate processing apparatus according to the fifth embodiment is configured to adjust the target pressure setting value (the pressure target value) in the exhaust path 354 based on the pressure value detected by the pressure sensor 31 and the temperature difference between the center side and the periphery side of the target wafer 12 (hereinafter referred to as a "temperature distribution"). Some of the components identical with those of the substrate processing apparatus 1 in the first embodiment are neither illustrated nor described.

The control program 40 used in the fifth embodiment includes the process control unit 400, the temperature control unit 410, the process gas flow rate control unit 412, the drive control unit 414, the pressure control unit 416, the process gas exhaust device control unit 418, the temperature measurement unit 420, the cooling gas flow rate control unit 422, and the temperature setting value storage unit 424. FIG. 11 illustrates the process control unit 400, the temperature control unit 410, the cooling gas flow rate control unit 422, and the temperature setting value storage unit 424. The process gas flow rate control unit 412, the drive control unit 414, the pressure control unit 416, the process gas exhaust device control unit 418, and the temperature measurement unit 420 are not shown in FIG. 11. Similar to the substrate processing apparatus 1 of the first embodiment, the control program is supplied to the control unit 2 via, for example, the recording medium 240 (see FIG. 4), loaded onto the memory 204, and is executed.

The temperature control unit 410 includes a pressure setting value adjustment unit 4102. The pressure setting value adjustment unit 4102 calculates and sets a desired temperature distribution of the wafer 12 using a correlation table of film thicknesses and temperature distributions previously registered in the temperature setting value storage unit 424.

The pressure setting value adjustment unit 4102 compares the temperature detected by the temperature measurement device 372 with the temperature distribution registered in the temperature setting value storage unit 424, and calculates a pressure setting value in the upstream position of the cooling gas exhaust device 356, which makes the temperature distribution of the wafer 12 become a preset distribution. Then, the pressure setting value adjustment unit 4102 sends the pressure setting value to the cooling gas flow rate control unit 422 via the process control unit 400. Instead of sending the pressure setting value from the pressure setting value adjustment unit 4102 to the cooling gas flow rate control unit 422 via the process control unit 400, it may be possible to directly send the pressure setting value from the pressure setting value adjustment unit 4102 to the cooling gas flow rate control unit 422.

The control of the cooling gas exhaust device 356 pursuant to sending the pressure setting value from the pressure setting value adjustment unit 4102 is executed until the temperature distribution becomes a preset value. For example, PID computation is used as in the fourth embodiment described above. By setting a PID constant, it is possible to realize rapid and stable temperature control while excessive temperature fluctuation is suppressed. Further, the temperature control unit 410 including the pressure setting value adjustment unit 4102 controls the pressure in the upstream position of the cooling gas exhaust device 356 by presenting the pressure setting value to the cooling gas exhaust device 356 and adjusts the target pressure setting value, based on the temperature detected by the temperature measurement device 372 and the temperature distribution set by the pressure setting value adjustment unit 4102.

Figure 12:
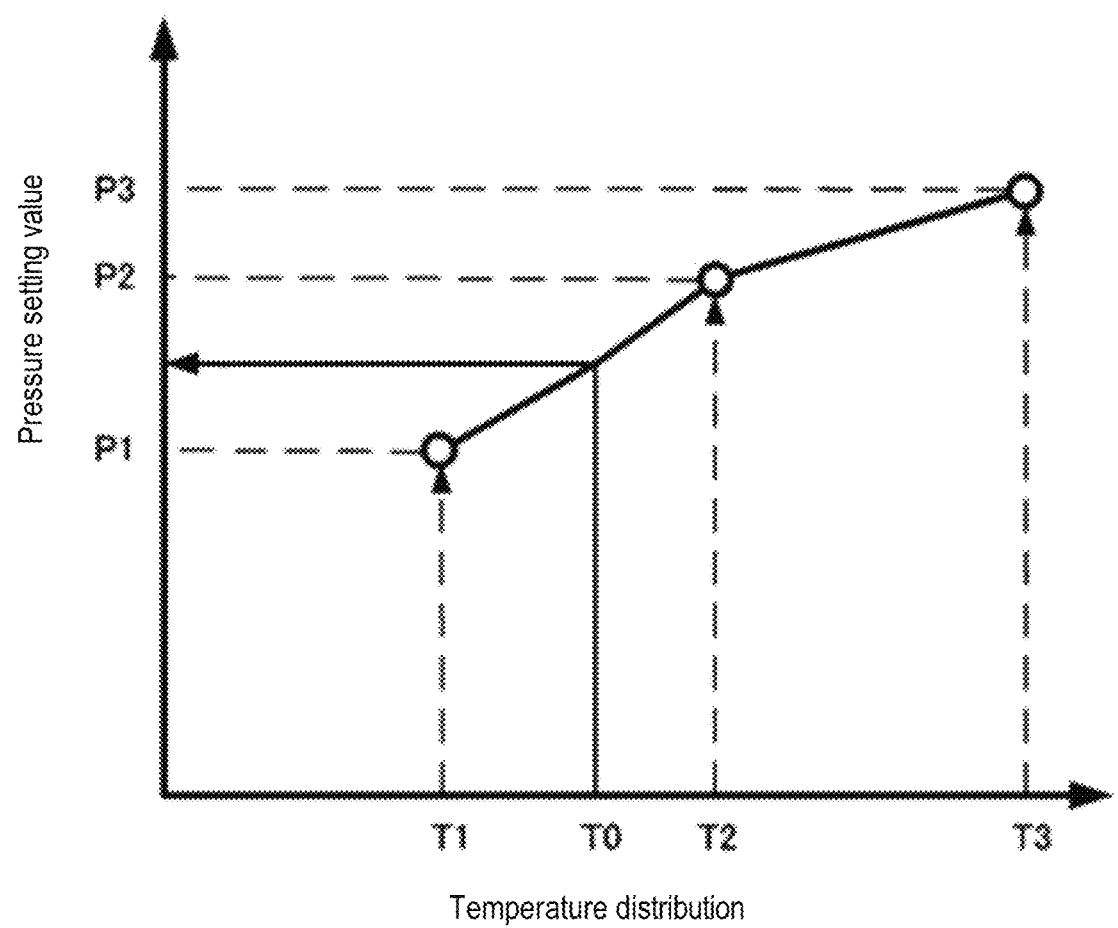
FIG. 12 is a view illustrating an example of a calculation of pressure setting values in the substrate processing apparatus according to the fifth embodiment of the present disclosure.

FIG. 12 illustrates an example of the calculation of the pressure setting value performed by the pressure setting value adjustment unit 4102. Prior to the calculation, the pressure setting values corresponding to the respective temperature distribution values of the wafer 12 are previously registered, for example, in the temperature setting value storage unit 424. Correlation table data of the pressure setting values and the temperature distribution values are acquired and inputted.

As illustrated in FIG. 12, when a pressure setting value P1 at a temperature distribution value of T1, a pressure setting value P2 at a temperature distribution value of T2, and a pressure setting value P3 at a temperature distribution value of T3 are registered for the temperature distribution values having a relationship of T1<T2<T3, if it is intended to obtain a desired temperature distribution value T0, it is possible to find a pressure setting value corresponding to the desired temperature distribution value T0 by performing linear supplement with the temperature distribution values (T1 and T2 in the example of FIG. 12) which interposes T0 therebetween. The pressure setting value found in the aforementioned manner is set as the pressure target value S described in the fourth embodiment. The control of the frequency of the cooling gas exhaust device 356 is executed such that the deviation D between the pressure target value and the pressure value A measured by the pressure sensor 31 becomes 0.

In the substrate processing apparatus according to the fifth embodiment, the same control as used in the first embodiment, the second embodiment, and the third embodiment is applied to the heating control and the process gas supply control executed by the control unit 2.

Figure 13:
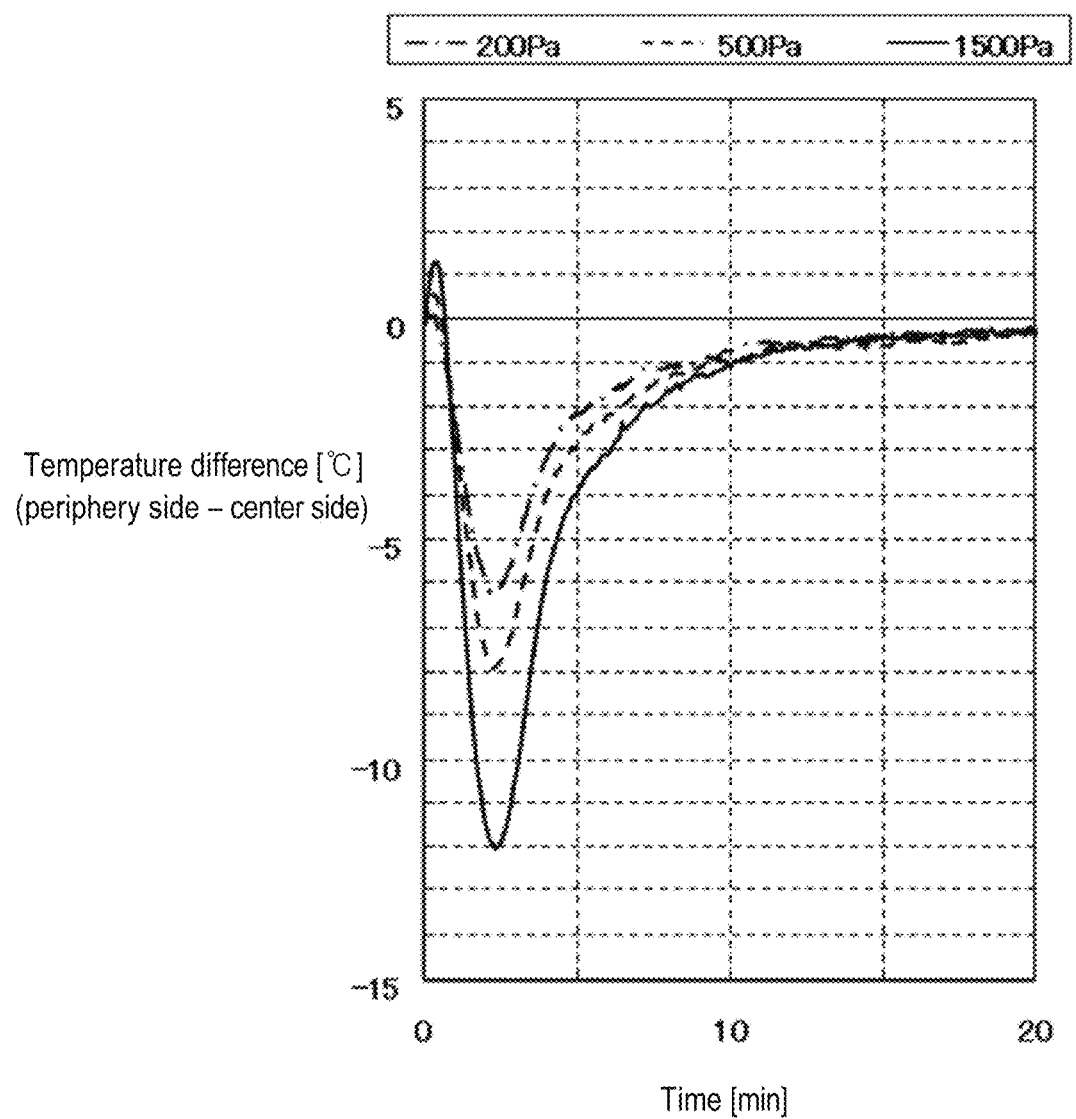
FIG. 13 is a view illustrating a temperature difference between a wafer center side and a wafer periphery side when a pressure setting value is changed in the substrate processing apparatus according to the fifth embodiment of the present disclosure.

FIG. 13 is a view illustrating the temperature difference between the center side and the periphery side of the wafer 12 when the second control described in the second embodiment and the third embodiment is executed at different pressure setting values. As illustrated in FIG. 13, if the pressure setting value increases, the temperature difference between the center side and the periphery side of the wafer 12 when the operation of the cooling device is stopped increases. Accordingly, the calculation of the pressure setting value illustrated in FIG. 12 may be applied to the calculation of the pressure setting value in the fifth embodiment when executing the second control described in the second embodiment and the third embodiment.

As described above, in the fifth embodiment, the target temperature distribution can be realized by setting the exhaust pressure corresponding to the target temperature distribution value (the temperature difference between the center side and the periphery side of the wafer 12). Furthermore, in the fifth embodiment, it is possible to obtain the same effects as described in the first embodiment, the second embodiment, and the third embodiment, even if there is a variation or a change in the exhaust pressure of the facility connected to the exhaust hole 358.

Sixth Embodiment

Next, a sixth embodiment of the present disclosure is described below.

In the second embodiment as described above, the heating control and the process gas supply control are improved to switch the first control (in which the cooling device cools the wafer while the heating device heats the wafer from the periphery side of the wafer) and the second control (in which the operation of at least the cooling device is stopped after the first control) during the process gas supply period. As a result, by supplying the process gas during the execution of the second control, the effect of cooling the periphery portion of the waver can be achieved more efficiently than in the first embodiment. In the sixth embodiment, the heating control is further improved so as to further enhance decreasing the temperature of the wafer periphery portion.

FIG. 14 is a timing chart illustrating an example of the heating control and the process gas supply control of a substrate processing apparatus according to the sixth embodiment of the present disclosure. Since the configuration of the substrate processing apparatus 1 according to the sixth embodiment is the same as the configuration of the substrate processing apparatus 1 according to the first embodiment, the descriptions for the substrate processing apparatus 1 are omitted.

As illustrated in FIG. 14, the control unit 2 first operates the heating device (specifically, the temperature control part 320 of the heater 32) so that the temperature detected by the internal temperature sensor 324 is increased from a standby temperature to a process temperature. As a result, the temperature of the center side of the wafer 12 is increased to a preset temperature. If the temperature detected by the internal temperature sensor 324 reaches the process temperature (if the temperature of the center side of the wafer 12 reaches the preset temperature), the control unit 2 starts operation of the cooling device (starts the third control).

In the sixth embodiment of the present disclosure, if the temperature detected by the internal temperature sensor 324 is stabilized at the process temperature (if the temperature of the center side of the wafer 12 is stabilized at the preset temperature), the control unit 2 stops the operation of the cooling device and operates the process gas flow rate control device 374. Further, the control unit 2 operates the process gas flow rate control device 374 so as to decrease the preset temperature at a specific temperature decrease speed and starts the supply of the process gas into the process chamber 3 (the interior of the outer tube 360).

As described in the second embodiment of the present disclosure, in the sixth embodiment, the temperature difference between the center side and the periphery side of the wafer 12 increases for a specific time period after the operation of the cooling device is stopped. This means that the temperature of the periphery side of the wafer 12 decreases largely when compared with the temperature of the center side. As such, if the operation of the cooling device is stopped from the operating state, the temperature of the periphery side of the wafer is temporarily decreased faster than the temperature of the center side of the wafer. The reason is the same as that of the second embodiment. Thus, the descriptions for the foregoing reasons are omitted.

Accordingly, in the sixth embodiment, when the supply of the process gas into the process chamber 3 is started by operating the process gas flow rate control device 374, the operation of the cooling device is stopped and the preset temperature of the heating device is actively decreased. Thus, as compared with the second embodiment, the temperature detected by the internal temperature sensor 324 can be decreased. The output of the heating device decreases along with the decrease of the temperature. The temperature of the periphery side of the wafer 12 can be largely decreased when compared with the temperature of the center side. Therefore, a large temperature difference can be caused between the center side and the periphery side of the wafer 12. Thus, thickness uniformity of the film formed on the wafer can be controlled effectively and the film thickness uniformity can be further improved.

Descriptions with reference to FIG. 14 follow. In the following descriptions, the control in which the temperature detected by the internal temperature sensor 324 (the temperature of the center side of the wafer) is decreased to be lower than the process temperature by setting the preset temperature of the heating device at a temperature equal to or higher than an activation temperature of the used process gas and to be lower than the process temperature during the time period in which the operation of at least the cooling device is stopped after the above first control while the process gas is supplied (the time period indicated as "DEPO" in FIG. 14) will be referred to as "third control".

[Start Timing of Third Control]

The start timing of the third control is the same as the start timing of the second control in the second embodiment.

The execution time period of the first control is set to be a predetermined time period (a time period in which the temperature difference between the center side and the periphery side of the wafer 12 reaches a desired temperature by the first control while the temperature of the center side of the wafer 12 is maintained to be a specific temperature). After executing the first control for the time period, the third control is started.

In the sixth embodiment, similar to the second embodiment, the third control is started before the temperature of the periphery side of the wafer 12 decreases to be lower than the temperature of the center side. Thus, similar to the second embodiment, in the sixth embodiment, a cooling device whose cooling performance is lower than that of the first embodiment can be employed. In addition, in the sixth embodiment, the cooling device is not continuously operated for a long period of time. Thus, the load of the heating device due to the cooling is reduced. Accordingly, contrary to the above descriptions, the cooling performance of the cooling device can be improved, the periphery side of the wafer 12 can be cooled in a short period of time, and the execution time period of the first control can be shortened.

[Execution Time Period of Third Control]

As illustrated in FIG. 14, the third control is executed for a period of time after the first control. During the execution of the third control, the process gas flow rate control device 374 is operated to supply the process gas into the process chamber 3.

The execution time period of the third control is determined in advance by experiments or the like. Although operation of the cooling device is stopped, temperature in the outer tube 360 decreases due to natural heat dissipation. Thus, the control unit 2 controls the heating device so that the temperature detected by the internal temperature sensor 324 is corresponded to be at the preset temperature which decreases with a constant gradient (temperature decrease rate). As compared with the second control, an amount of heat applied by the heating device is reduced as much as the decrease of the preset temperature, and thus, the temperature decrease due to the natural heat dissipation increases. As described above, the heating device heats the wafer 12 from the periphery side of the wafer 12. Therefore, while the cooling device is stopped, the temperature of the wafer 12 is more easily increased at its periphery side than at its center side. Accordingly, when the time period, in which the temperature of the periphery side of the wafer decreases faster than the temperature of the center side of the wafer, is elapsed after the cooling device is stopped, the temperature difference between the center side and the periphery side becomes smaller. Eventually, the temperature of the periphery side exceeds the temperature of the center side. Thus, the time period, in which a difference equal to or larger than a specific temperature can be generated between the center side and the periphery side of the wafer 12, namely, the time period, in which the temperature of the periphery side can be maintained to be lower than the temperature of the center side by a specific temperature or more, is measured in advance by experiments or the like. The time period as measured above is set as the execution time period of the third control.

If a desired thickness for a film cannot be formed during the execution time period of the third control, that is, if the execution time period of the third control fails to meet a specified process time period, the cooling device is operated again to execute the first control. The preset temperature is increased to the process temperature. The temperatures of the center side and the periphery side of the wafer 12 are set to preset temperatures (the temperature difference between the center side and the periphery side of the wafer 12 is set to a preset temperature). Thereafter, the operation of the cooling device is stopped again to execute the third control and the supply of the process gas is performed. In this manner, a specific process time period can be secured by alternately and repeatedly executing the first control and the third control a predetermined number of times.

In FIG. 14, a start timing of the third control (a timing at which the operation of the cooling device is stopped) and a start timing of the supply of the process gas are brought into coincidence with each other. An end timing of the third control (a timing at which the operation of the cooling device is resumed) and an end timing of the supply of the process gas are brought into coincidence with each other. However, the process gas needs to be supplied at least for a certain period of time while the third control is performed. Accordingly, for example, the start timing of the supply of the process gas may be set to be later than the start timing of the third control. Furthermore, the end timing of the supply of the process gas may be set to be earlier than the end timing of the third control. As such, if the process gas is supplied for a specified time period while the third control is executed at least after the first control is switched to the third control, efficient cooling effect for the periphery side of the wafer by using the third control can be achieved. However, to secure a process time period, the execution time period of the third control and the supply time of the process gas may be brought into coincidence with each other.

Although the preset temperature is decreased from the process temperature in the third control, the preset temperature may be decreased from a temperature higher than the process temperature. In the third control, the preset temperature may be decreased only in a specific heating region so that the reduction gradient of the preset temperature can be used as an inter-wafer film thickness adjustment value.

While the first to sixth embodiments have been described above, the respective embodiments as described above, modifications thereof, and applications thereof may be suitably combined with one another. The effects of the respective embodiments may also be obtained in combination.

INDUSTRIAL USE OF THE PRESENT DISCLOSURE

As described above, the present disclosure can be used in a substrate processing apparatus, a substrate processing method, a semiconductor device manufacturing method, and a control program, which are capable of controlling thickness uniformity of a film formed on a substrate.

EXPLANATION OF REFERENCE NUMERALS

1: substrate processing apparatus
12: wafer (substrate)

14: boat
100: cassette delivery unit
102: cassette stocker
106: wafer transfer machine
108: boat elevator
490: wafer cassette
2: control unit
22: display/input unit
200: CPU
204: memory
24: recording unit
240: recording medium
40: control program
400: process control unit
410: temperature control unit
4102: pressure setting value adjustment unit
412: process gas flow rate control unit
414: drive control unit
416: pressure control unit
418: process gas exhaust device control unit
420: temperature measurement unit
422: cooling gas flow rate control unit
4220: subtractor
4222: PID computing unit
4224: frequency converter
4226: frequency indicator
424: temperature setting value storage unit
3: process chamber
300: heat insulator
31: pressure sensor
32: heater
320: temperature control part
322, 324: temperature sensor
340: gas supply nozzle
344: lid member of a furnace port
346: exhaust pipe
348: rotation shaft
350: manifold
351: O-ring
352: cooling gas flow path
353: intake hole
354: exhaust path
355: exhaust unit
356: cooling gas exhaust device
357: radiator
358: exhaust hole
359: shutter
360: outer tube
362: inner tube
370: temperature control device
372: temperature measurement device
374: MFC
376: EC
378: PS
380: APC
382: EP
384: inverter

What is claimed is:

1. A method of manufacturing a semiconductor device comprising:
transferring a substrate to a process chamber;
executing a STABLE period by cooling the substrate transferred to the process chamber while heating the substrate from its outer peripheral side; and
after the STABLE period, executing a DEPOSITION period by:
(a) executing an operation of the cooling the substrate and an operation of supplying a process gas simultaneously from a start of the DEPOSITION period for a specific time period, such that a temperature on the outer peripheral side of the substrate is stabilized to be lower than a temperature on a central side of the substrate by a predetermined temperature amount; and
(b) after the specific time period, stopping the operation of the cooling the substrate while the process gas is supplied during the DEPOSITION period, such that a difference between the temperature on the outer peripheral side of the substrate and the temperature on the central side of the substrate is larger than the predetermined temperature amount,
wherein (b) includes:
(c) stopping the operation of the cooling the substrate to increase a temperature of the process chamber and stopping or lowering an operation of the heating the substrate, to thereby increase heat transfer from the process chamber to outside of the process chamber and decrease the temperature on the outer peripheral side of the substrate faster than the temperature on the central side of the substrate; and
(d) after (c), controlling the operation of the heating the substrate to thereby set the temperature on the outer peripheral side of the substrate and the temperature on the central side of the substrate to be a process temperature.

2. The method of claim 1, wherein the process gas starts to be supplied into the process chamber when the STABLE period is being executed.

3. The method of claim 1, wherein the process gas is supplied into the process chamber concurrently with a timing of starting the DEPOSITION period.

4. The method of claim 1, further comprising performing a control such that the operation of the heating the substrate, the operation of the cooling the substrate, and the operation of the supplying the process gas are executed alternately and repeatedly a predetermined number of times.

5. The method of claim 1, wherein the process gas is supplied into the process chamber at a timing that is different from a timing of starting the DEPOSITION period.

6. The method of claim 1, further comprising:
controlling at least a temperature of the substrate; and
performing a feedback control during the operation of the heating the substrate.

7. The method of claim 1,
wherein the operation of the heating the substrate is executed at a set rate that gradually decreases from the process temperature; and the process gas is supplied into the process chamber during the executing the DEPOSITION period.

8. The method of claim 7, wherein the process gas is supplied into the process chamber concurrently with a timing of starting the DEPOSITION period.

9. The method of claim 7, wherein the process gas is supplied into the process chamber at a timing that is different from a timing of starting the DEPOSITION period.

10. The method of claim 7, further comprising:
controlling the operation of the heating the substrate by setting a preset temperature; and
performing a control such that the preset temperature is lowered at a predetermined temperature drop rate and the process gas is supplied into the process chamber at a timing of starting the DEPOSITION period.

11. The method of claim 1, wherein the operation of the cooling the substrate and the operation of the heating the substrate are executed simultaneously from the start of the DEPOSITION period for the specific time period.

12. The method of claim 1, wherein the operation of the cooling the substrate and the operation of the heating the substrate are executed simultaneously during the STABLE period.

13. The method of claim 12, wherein the STABLE period starts after a temperature in the process chamber reaches the process temperature.

14. The method of claim 13, wherein the detected temperature of the central side of the substrate is the process temperature.

15. The method of claim 1, wherein when the difference between the detected temperature of the outer peripheral side of the substrate and the detected temperature of the central side of the substrate is equal to or lower than the predetermined temperature for a predetermined time period, the DEPOSITION period is started.

16. The method of claim 1, wherein the predetermined temperature is equal to or less than 1 degree C.

17. The method of claim 7, wherein the operation of the cooling the substrate and the operation of the heating the substrate is executed simultaneously during the STABLE period.

18. The method of claim 17, wherein the STABLE period starts after a temperature in the process chamber reaches the process temperature.

* * * * *